(12) United States Patent
Hou et al.

(10) Patent No.: US 12,720,775 B2
(45) Date of Patent: Aug. 25, 2026

(54) PACKAGES WITH CHIPS COMPRISING INDUCTOR-VIAS AND METHODS FORMING THE SAME

(71) Applicant: Taiwan Semiconductor Manufacturing Co., Ltd., Hsinchu (TW)

(72) Inventors: Hao-Cheng Hou, Hsinchu (TW); Tsung-Ding Wang, Tainan (TW); Jung Wei Cheng, Hsinchu (TW); Chien-Hsun Lee, Chu-tung Town (TW); Shang-Yun Hou, Jubei City (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 604 days.

(21) Appl. No.: 18/150,624

(22) Filed: Jan. 5, 2023

(65) Prior Publication Data

US 2024/0047509 A1 Feb. 8, 2024

Related U.S. Application Data

(60) Provisional application No. 63/380,838, filed on Oct. 25, 2022, provisional application No. 63/370,327, filed on Aug. 3, 2022.

(51) Int. Cl.
*H01L 21/48* (2006.01)
*H10D 1/20* (2025.01)
(Continued)

(52) U.S. Cl.
CPC ............... *H10D 1/20* (2025.01); *H10D 86/85* (2025.01); *H10W 70/05* (2026.01); *H10W 70/093* (2026.01); *H10W 70/095* (2026.01); *H10W 70/611* (2026.01); *H10W 70/614* (2026.01); *H10W 70/65* (2026.01); *H10W 70/685* (2026.01); *H10W 74/016* (2026.01);
(Continued)

(58) Field of Classification Search
None
See application file for complete search history.

(56) References Cited

U.S. PATENT DOCUMENTS 10,510,722 B2 12/2019 Chen et al.
10,566,229 B2 * 2/2020 Shih .................... H01L 21/6835
(Continued)

FOREIGN PATENT DOCUMENTS

| | | | |
|---|---|---|---|
| CN | 111081683 | A | 4/2020 |
| TW | 201906125 | A | 2/2019 |
| TW | 11773354 | B | 8/2022 |

*Primary Examiner* — Long Pham
(74) *Attorney, Agent, or Firm* — Slater Matsil, LLP

(57) ABSTRACT

A method includes forming an inductor die, which includes forming a metal via over a substrate, forming a magnetic shell encircling the metal via, with the metal via and the magnetic shell collectively forming an inductor, and depositing a dielectric layer around the magnetic shell. The method further includes placing the inductor die over a carrier, encapsulating the inductor die in an encapsulant, forming redistribution lines electrically connecting to the inductor, and bonding a device die to the redistribution lines. The device die is electrically coupled to the inductor through the redistribution lines.

20 Claims, 26 Drawing Sheets

(51) Int. Cl.

| | |
|---|---|
| ***H10D 86/85*** | (2025.01) |
| ***H10W 70/05*** | (2026.01) |
| ***H10W 70/60*** | (2026.01) |
| ***H10W 70/65*** | (2026.01) |
| ***H10W 70/685*** | (2026.01) |
| ***H10W 74/01*** | (2026.01) |
| ***H10W 74/10*** | (2026.01) |
| ***H10W 90/00*** | (2026.01) |
| *H10B 80/00* | (2023.01) |

(52) U.S. Cl.
CPC .......... *H10W 74/117* (2026.01); *H10W 90/00* (2026.01); *H10W 90/401* (2026.01); *H10W 90/701* (2026.01); *H10B 80/00* (2023.02)

(56) References Cited

U.S. PATENT DOCUMENTS

| | | | | |
|---|---|---|---|---|
| 2022/0406736 | A1* | 12/2022 | Marin | H01L 23/49827 |
| 2023/0387058 | A1 | 11/2023 | Huang et al. | |
| 2024/0055468 | A1* | 2/2024 | Chen | H01L 21/6835 |
| 2024/0371915 | A1 | 11/2024 | Tzeng et al. | |

* cited by examiner 10
28
22
20
24
24
24
24
24
26

10
28
22
20
24
24
24
24
24
26

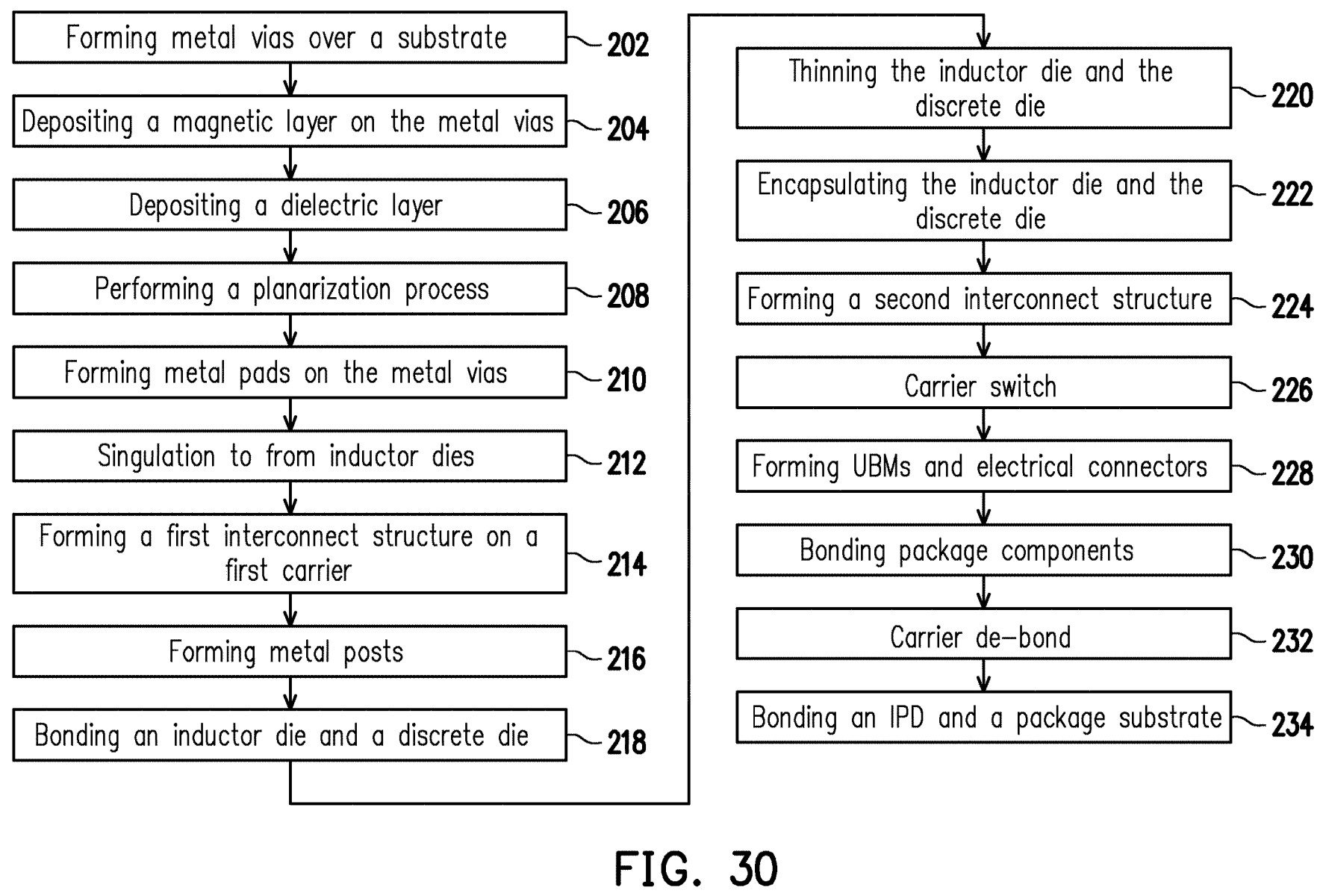

202 Forming metal vias over a substrate

204 Depositing a magnetic layer on the metal vias

206 Depositing a dielectric layer

208 Performing a planarization process

210 Forming metal pads on the metal vias

212 Singulation to from inductor dies

214 Forming a first interconnect structure on a first carrier

216 Forming metal posts

218 Bonding an inductor die and a discrete die

220 Thinning the inductor die and the discrete die

222 Encapsulating the inductor die and the discrete die

224 Forming a second interconnect structure

226 Carrier switch

228 Forming UBMs and electrical connectors

230 Bonding package components

232 Carrier de-bond

234 Bonding an IPD and a package substrate

FIG. 30

PACKAGES WITH CHIPS COMPRISING INDUCTOR-VIAS AND METHODS FORMING THE SAME

PRIORITY CLAIM AND CROSS-REFERENCE

This application claims the benefit of U.S. Provisional Application No. 63/370,327, filed on Aug. 3, 2022, and entitled "Via with High Inductance in CoWoS-L+ and CoWoS-L," and U.S. Provisional Application No. 63/380,838, filed Oct. 25, 2022 and entitled "Packages with Chips Comprising Inductor-Vias and Methods Forming the Same," which applications are hereby incorporated herein by reference.

BACKGROUND

Integrated circuit applications currently have increasingly more functions built therein, and are thus formed to be increasingly larger. Accordingly, many types of packages have been developed to suit to customized requirements of integrated circuits. Power networks are also built inside the packages to provide power to the device dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 30 illustrates a process flow for forming a package in accordance with some embodiments.

DETAILED DESCRIPTION

Figures 1, 2:
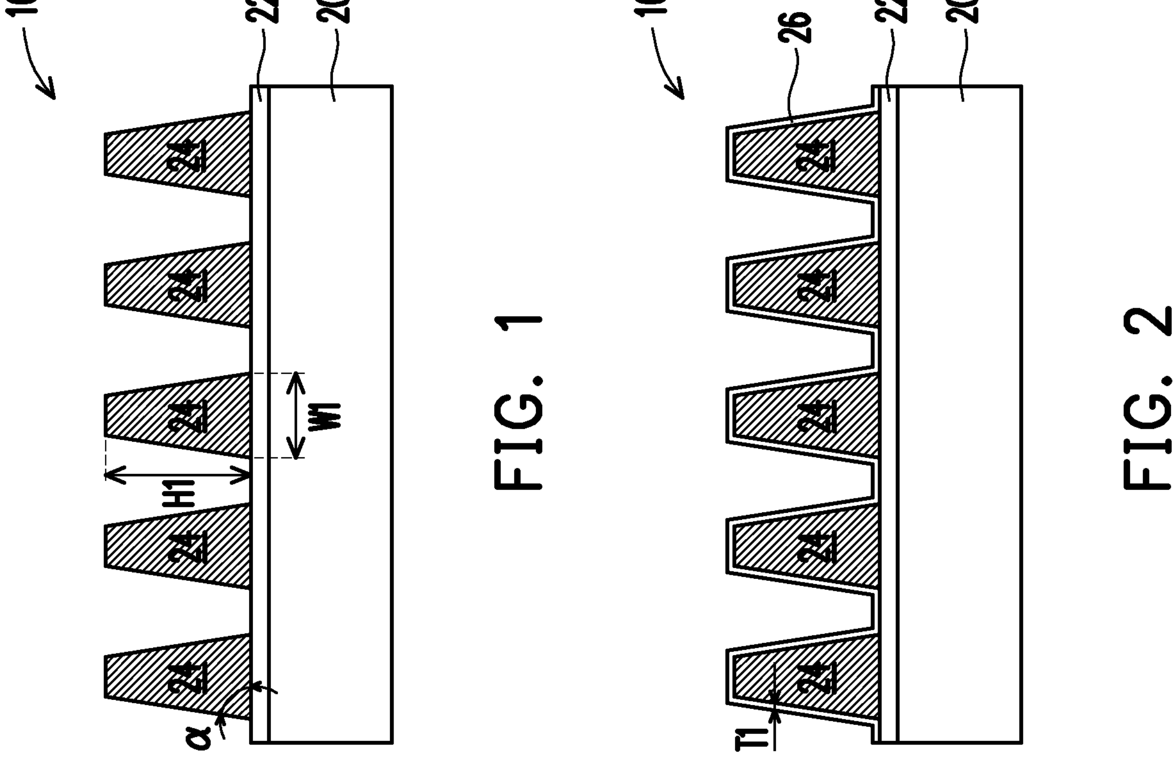
FIGS. 1-5 illustrate the cross-sectional views of intermediate stages in the formation of an inductor die formed of metal vias in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package including an inductor die and the method of forming the same are provided. In accordance with some embodiments, an inductor die is formed including conductive vias, which are formed by plating a metallic material over a carrier. A magnetic material is deposited on the conductive vias to form magnetic shells, so that an inductor (s) may be formed. The inductor die is encapsulated in an encapsulant. The inductor die may be electrically interconnected with other passive devices such as capacitors and resistors to regulate power in the package. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1 through 5 illustrate the cross-sectional views of intermediate stages in the formation of an inductor die in accordance with some embodiments. The corresponding processes are also reflected schematically in the process flow 200 as shown in FIG. 30.

Referring to FIG. 1, wafer 10 is formed as including substrate 20 therein. In accordance with some embodiments, substrate 20 is a semiconductor substrate, a dielectric substrate, or the like. For example, when formed of a semiconductor, substrate 20 may be a silicon substrate. When formed of a dielectric, substrate 20 may be formed of or comprise silicon oxide, silicon nitride, glass, or the like.

Dielectric layer 22 may be formed on substrate 20. In accordance with some embodiments, dielectric layer 22 is formed of or comprises an inorganic dielectric material such as silicon oxide, silicon nitride, silicon carbide or the like. In accordance with alternative embodiments, dielectric layer 22 may be formed of or comprise a polymer, which may be a photo-sensitive polymer such as polybenzoxazole (PBO), polyimide, benzocyclobutene (BCB), or the like. In accordance with alternative embodiments, dielectric layer 22 is not formed, and the subsequently formed metal vias are formed directly on substrate 20.

Metal vias 24 are formed over substrate 20, and may be formed over dielectric layer 22 when dielectric layer 22 is formed. The respective process is illustrated as process 202 in the process flow 200 as shown in FIG. 30. In accordance with some embodiments, metal vias 24 have a lateral dimension (such as a diameter) W1 in the range between about 10

μm and about 100 μm. The aspect ratio H1/W1 of metal vias 24 may be in the range between about 0.5 and about 4.

The formation of metal vias 24 may include depositing a metal seed layer (not shown) over substrate 20 (and over dielectric layer 22 if it is formed). In accordance with some embodiments, the metal seed layer may be formed of or comprise a titanium layer and a copper layer over the titanium layer. Alternatively, the metal seed layer may comprise a copper layer or a copper alloy layer. A plating mask (not shown) is then formed over the metal seed layer. The plating mask may be formed of or comprise a photoresist. The plating mask is then patterned, for example, through a light-exposure process followed by a development process, so that openings are formed, through which some portions of the metal seed layer are exposed. A plating process is then performed to plate a metallic material into the openings in the plating mask. The plated metallic material may comprise copper, aluminum, aluminum copper, nickel, silver, gold, or the like, or alloys thereof. The plating mask is then removed, followed by the etching of the exposed portions of the metal seed layer to form metal vias 24.

In accordance with some embodiments, the sidewalls of metal vias 24 have an inner tilt angle $\alpha$. The inner tilt angle $\alpha$ is formed to be small, for example, smaller than about 90 degrees or 85 degrees, so that it is easier to form magnetic shell 26 (FIG. 2) with better quality and better conformity. The inner tilt angle $\alpha$ may also be in the range between about 75 degrees and 90 degrees, or between about 75 degrees and about 85 degrees, in accordance with some embodiments. To achieve the desirable inner tilt angle $\alpha$, process conditions (such as focus depth, light-exposure duration, etc.) for forming the openings in the patterned lithography mask may be adjusted.

Referring to FIG. 2, magnetic layer 26, which comprises a magnetic material, is deposited. The respective process is illustrated as process 204 in the process flow 200 as shown in FIG. 30. In accordance with some embodiments, magnetic layer 26 is formed of or comprise CoZrTa, which includes a cobalt layer, a zirconium layer over the cobalt layer, and a tantalum layer over the zirconium layer. In accordance with alternative embodiments, magnetic layer 26 is formed of or comprise NiFe, FeSi, $Fe_3O_4$, or the like, or alloys thereof. The formation process may be performed through Physical Vapor Deposition (PVD), Chemical Vapor Deposition (CVD), Atomic Layer Deposition (ALD), or the like. Magnetic layer 26 may be a conformal layer, with the thickness variation being smaller than about 20 percent or smaller than about 10 percent, for example. In accordance with some embodiments, magnetic layer 26 has a thickness T1 in the range between about 1 μm and about 10 μm.

Figures 3, 4:
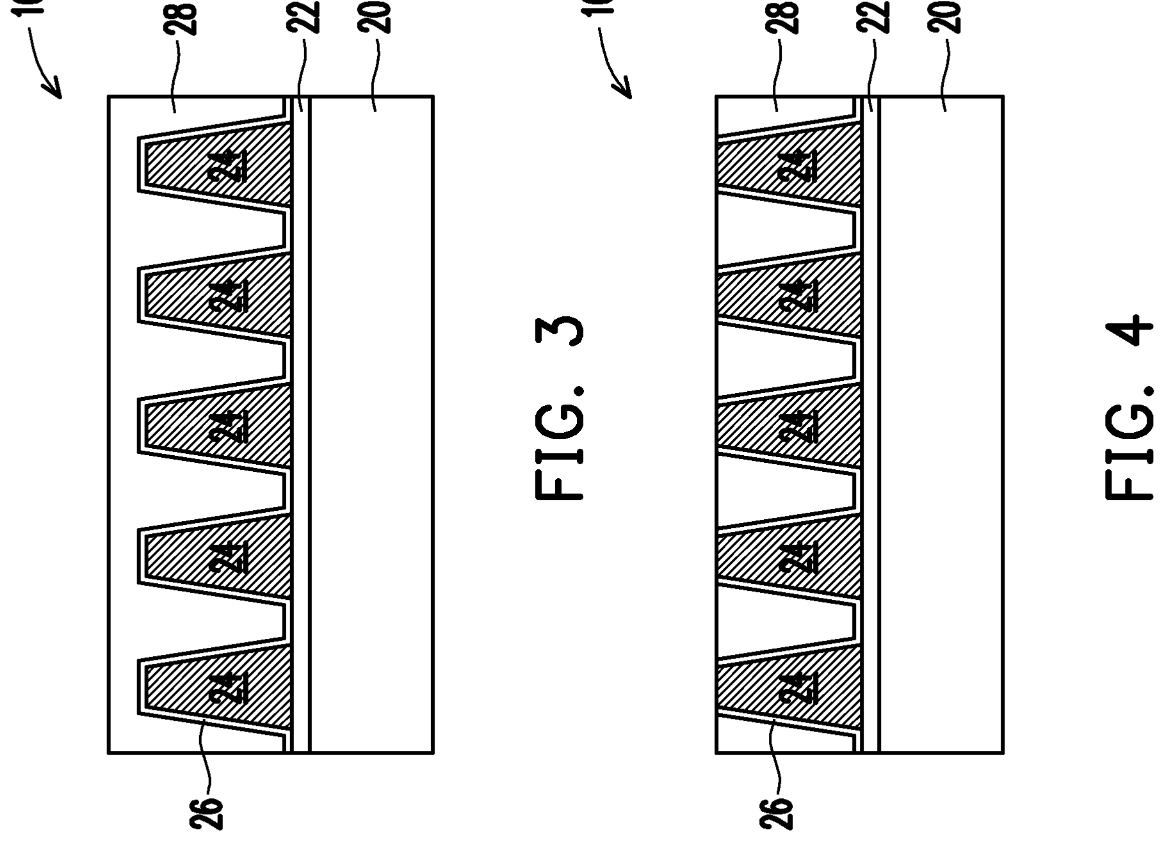

FIG. 3 illustrates the deposition of dielectric layer 28, which fills the spaces between the portions of magnetic layer 26 on neighboring metal vias 24. The respective process is illustrated as process 206 in the process flow 200 as shown in FIG. 30. In accordance with some embodiments, dielectric layer 28 is formed of or comprises an inorganic dielectric material such as silicon oxide, silicon nitride, silicon oxynitride, silicon oxycarbide, and/or the like. The formation process may include Chemical Vapor Deposition (CVD), Atomic Layer Deposition (ALD), Plasma Enhance Chemical Vapor Deposition (PECVD), or the like. In accordance with alternative embodiments, dielectric layer 28 is formed of or comprises an organic material such as a polymer, a resin, an epoxy, and/or the like. The polymer may include polyimide, polybenzoxazole (PBO), benzocyclobutene (BCB), or the like. The formation process may include dispensing the organic material in a flowable form, and then curing the organic material.

FIG. 4 illustrates a planarization process, in which the excess portions of dielectric layer 28 over metal vias 24 are removed. The respective process is illustrated as process 208 in the process flow 200 as shown in FIG. 30. In accordance with some embodiments, the planarization process comprises a Chemical Mechanical Polish (CMP) process or a mechanical grinding process. The portions of magnetic layer 26 on the top surfaces of metal vias 24 are removed, and hence metal vias 24 are exposed. The remaining portions of magnetic layer 26 on the sidewalls of metal vias 24 have cylindrical shapes, and are referred to as magnetic shells 26 hereinafter.

Figure 5:
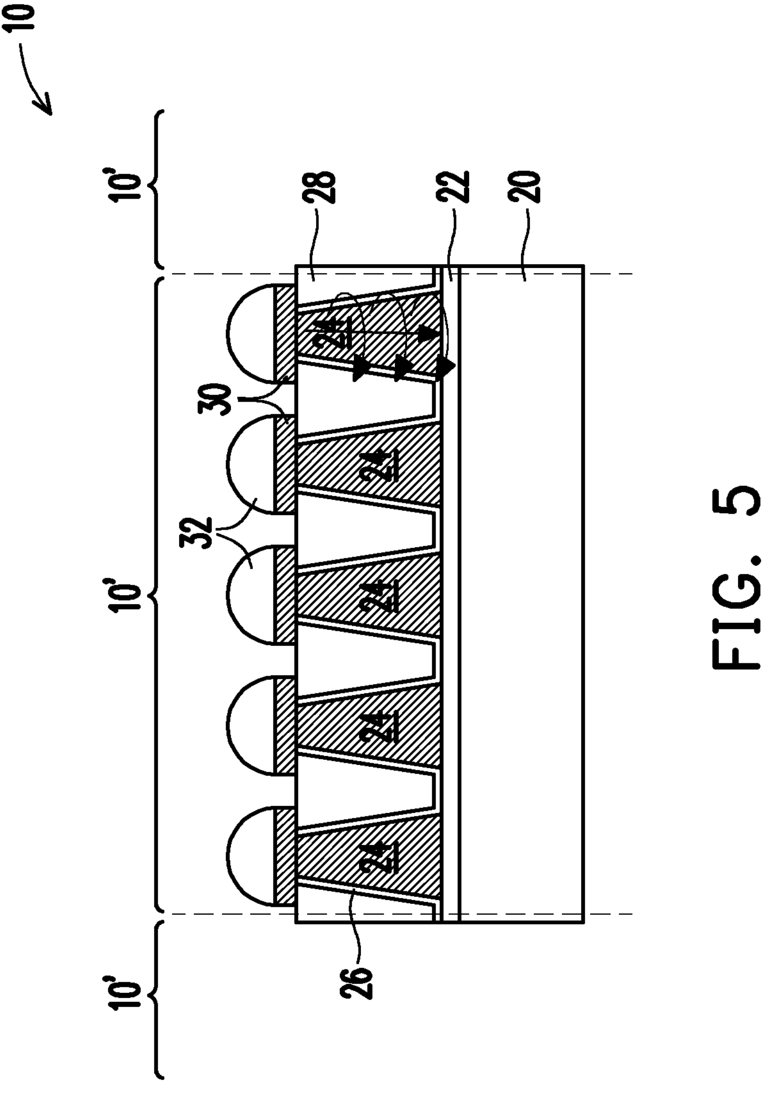

Referring to FIG. 5, metal pads 30 are formed. The respective process is illustrated as process 210 in the process flow 200 as shown in FIG. 30. In accordance with some embodiments, metal pads 30 are formed through a process similar to the process for forming metal vias 24, which process may include depositing a metal seed layer, forming a plating mask, and plating a metallic material in the openings in the plating mask. The materials and the formation processes of the metal seed layer and the plating material may be selected from the same groups of candidate materials and candidate formation processes of metal vias 24. In accordance with alternative embodiments, metal pads 30 may be formed by depositing a metallic material such as aluminum, aluminum copper, nickel, tungsten, and/or the like, and performing an etching process. Metal pads 30 may extend laterally beyond the edges of the respective underlying metal vias 24 and magnetic shells 26, so that metal pads 30 may prevent magnetic shells 26 from being exposed and contaminated in subsequent processes. Solder regions 32 may also be formed on metal pads 30.

A singulation process may be performed to saw wafer 10 into a plurality of discrete inductor dies 10' therein. The respective process is illustrated as process 212 in the process flow 200 as shown in FIG. 30. The horizontal portions of magnetic layer 26 may be removed in subsequent process (FIG. 11), so that each pair of metal via 24 and the corresponding magnetic shell 26 collectively form an inductor. The inductance is generated due to that the magnetic shell 26 may form a close-loop magnetic flux. Inductor dies 10' are free from active device dies, and may not (or may) include other types of passive devices (such as capacitors and resistors) other than inductor dies therein.

Figure 29:
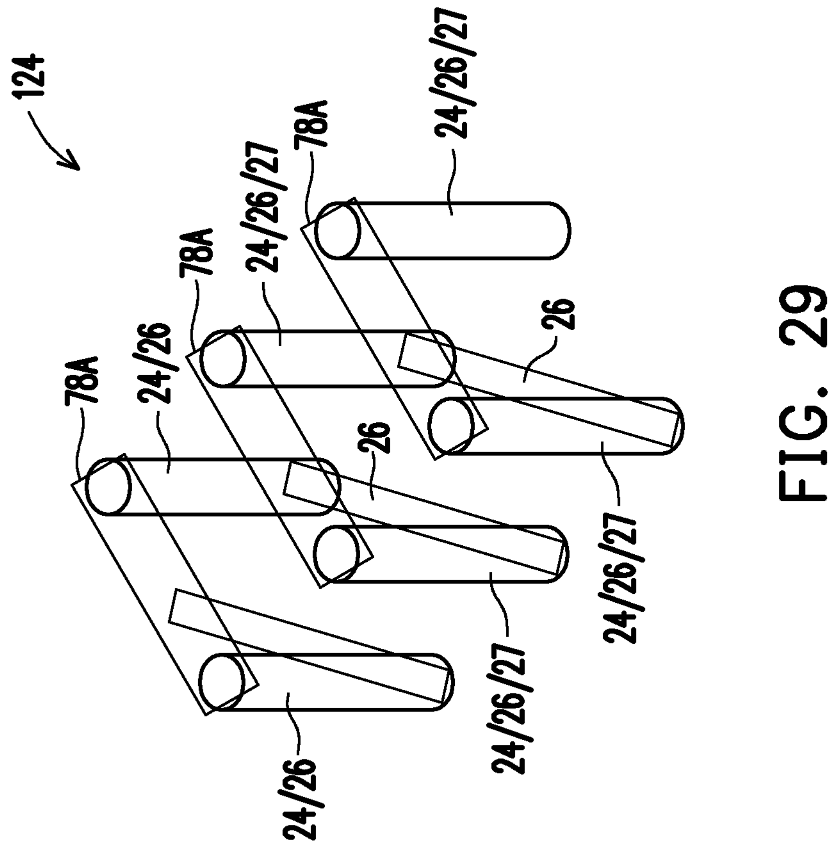
FIG. 29 illustrates an inductor comprising serially connected metal vias and magnetic shells in accordance with some embodiments.

In accordance with some embodiments, the top view of metal vias 24 may be rounded, while metal vias 24 may also adopt other top-view shapes such as hexagonal shapes, octagonal shapes, rectangular shapes or the like. Also, each inductor die 10' may include a single metal via 24 and a single magnetic shell 26 (excluding the horizontal portions of magnetic layer 26) therein. Alternatively, each inductor die 10' may include a plurality of metal vias 24 and a plurality of magnetic shells 26 (excluding the horizontal portions of magnetic layer 26) therein. When comprising a plurality of metal vias 24, the plurality of metal vias 24 may be arranged as two parallel rows, so that they can be connected as a larger inductor, which is referred to as a composite inductor hereinafter. An example connection scheme is shown in FIG. 29, which is discussed in subsequent paragraphs.

Figure 6:
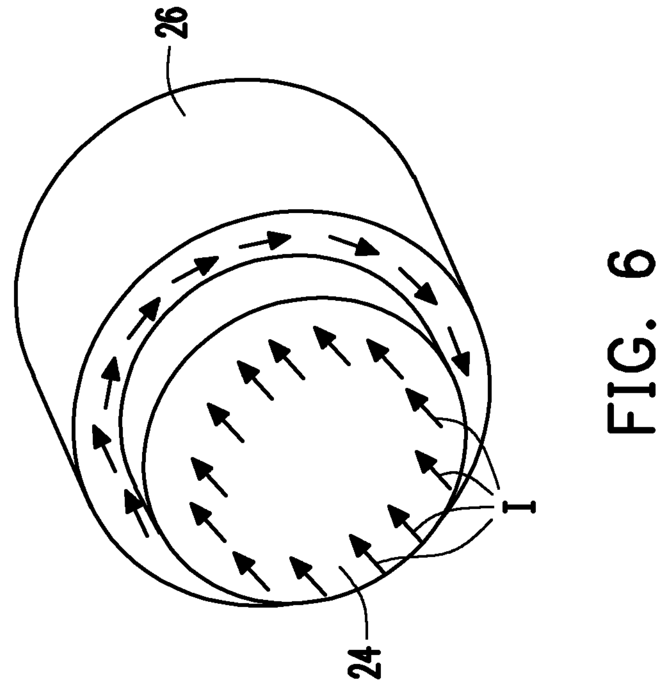
FIG. 6 illustrates a perspective view of an inductor formed of a metal via having a magnetic shell in accordance with some embodiments.

FIG. 6 illustrates a perspective view of one of metal vias 24 and the respective magnetic shell 26 in accordance with some embodiments. As shown in FIG. 6, when current I flows into or out of metal via 24, magnetic flux forms a closed loop in magnetic shell 26 and along the hard-axis of magnetic anisotropy, so that an inductor is formed by the metal via and the corresponding magnetic shell 26. The inductance value is related to the material of the magnetic shell 26, and appropriate material may be selected to achieve desirable inductance. When there are a plurality of metal vias and magnetic shells, a plurality of inductors are formed in the inductor die 10. The plurality of inductors may be used separately, serially connected, or parallel connected to have desirable inductance values.

Figures 7, 8:
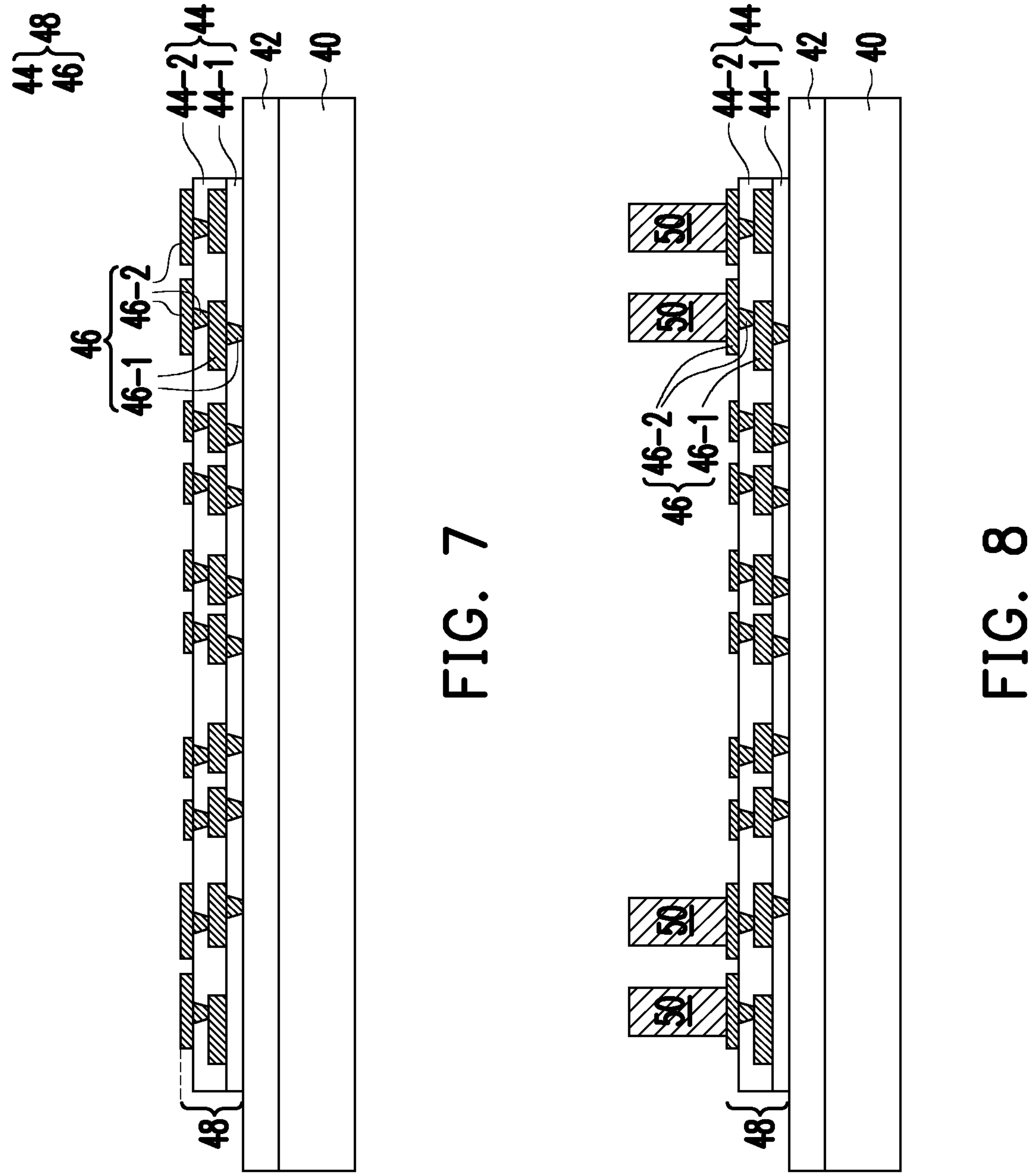
FIGS. 7-19 illustrate the cross-sectional views of intermediate stages in the formation of a package including an inductor die in accordance with some embodiments.

FIGS. 7 through 19 illustrate the intermediate stages in the formation of a package including inductor dies in accordance with some embodiments. FIG. 7 illustrates the formation of release film 42 on carrier 40. Carrier 40 may be a glass carrier, a silicon wafer, an organic carrier, or the like. Carrier 40 may have a round top-view shape in accordance with some embodiments. Release film 42 may be formed of a polymer-based material and/or an epoxy-based thermal-release material (such as a Light-To-Heat-Conversion (LTHC) material), which is capable of being decomposed under radiation such as a laser beam, so that carrier 40 may be de-bonded from the overlying structures that will be formed in subsequent processes. In accordance with some embodiments, release film 42 is applied on carrier 40 through coating.

A redistribution structure 48, which includes a plurality of dielectric layers 44 and a plurality of Redistribution Lines (RDLs) 46, is formed over the release film 42. The respective process is illustrated as process 214 in the process flow 200 as shown in FIG. 30. As shown in FIG. 7, a first dielectric layer 44-1 is formed on release film 42. In accordance with some embodiments, dielectric layer 44-1 is formed of or comprises an organic material, which may be a polymer. The organic material may also be a photo-sensitive material. For example, dielectric layer 44-1 may be formed of or comprises polyimide, PBO, BCB, or the like.

A first plurality of RDLs 46 (denoted as 46-1) are formed on dielectric layer 44-1. The formation of RDLs 46-1 may include patterning dielectric layer 44-1 to form via openings, forming a metal seed layer (not shown) over dielectric layer 44-1 and extending into the via openings, forming a patterned plating mask (not shown) such as a photoresist over the metal seed layer, and then performing a metal plating process to deposit a metallic material on the exposed metal seed layer. The patterned plating mask and the portions of the metal seed layer covered by the patterned plating mask are then removed, leaving RDLs 46-1 as shown in FIG. 7. In accordance with some embodiments, the metal seed layer includes a titanium layer and a copper layer over the titanium layer. The metal seed layer may be formed using, for example, PVD or a like process. The plating process may be performed using, for example, an electrochemical plating process or an electro-less plating process.

FIG. 7 further illustrates the formation of additional dielectric layer(s) 44-2 and additional RDLs (such as RDLs 46-2), for example. Throughout the description, dielectric layers 44-1 and 44-2 are individually and collectively referred to as dielectric layers 44, and RDLs 46-1 and 46-2 are individually and collectively referred to as RDLs 46. In accordance with some embodiments, dielectric layer 44-2 is first formed on RDLs 46-1. The bottom surface of dielectric layer 44-2 is in contact with the top surfaces of RDLs 46-1 and dielectric layer 44-1. Dielectric layer 44-2 may be formed of or comprise an organic dielectric material, which may be a polymer. For example, dielectric layer 44-2 may comprise a photo-sensitive material such as PBO, polyimide, BCB, or the like. Dielectric layer 44-2 is then patterned to form via openings (occupied by the via portions of RDLs 46-2) therein. Hence, some portions of RDLs 46-1 are exposed through the openings in dielectric layer 44-2.

Next, RDLs 46-2 are formed on dielectric layer 44-2 to connect to RDLs 46-1. RDLs 46-2 include via portions (also referred to as vias) extending into the openings in dielectric layer 44-2, and trace portions (metal line portions, or RDL lines) over dielectric layer 44-2. The formation of RDLs 46-2 may be similar to the formation of RDLs 46-1. Each of the vias may have a tapered profile, with the upper portions being wider than the corresponding lower portions.

After the formation of RDLs 46-2, there may be more dielectric layers and the corresponding RDLs formed, with the upper RDLs over and landing on the respective lower RDLs. The materials of the more dielectric layers may be selected from the same group (or different group) of candidate materials as dielectric layers 44-1 and 44-2, which candidate materials may include a polymer such as polyimide, PBO, BCB, or the like. Dielectric layers 44 and RDLs 46 collectively form redistribution structure 48.

Referring to FIG. 8, after the formation of interconnect structure 48, metal posts 50 may be formed. The respective process is illustrated as process 216 in the process flow 200 as shown in FIG. 30. The formation of metal posts 50 may include depositing a metal seed layer over RDLs 46, and forming a patterned plating mask, through which some portions of the metal seed layer are exposed. A plating process is then performed to plate a metallic material into the openings in the plating mask. The plating mask is then removed, followed by the etching of the exposed portions of the metal seed layer to form metal posts 50.

Figure 9:
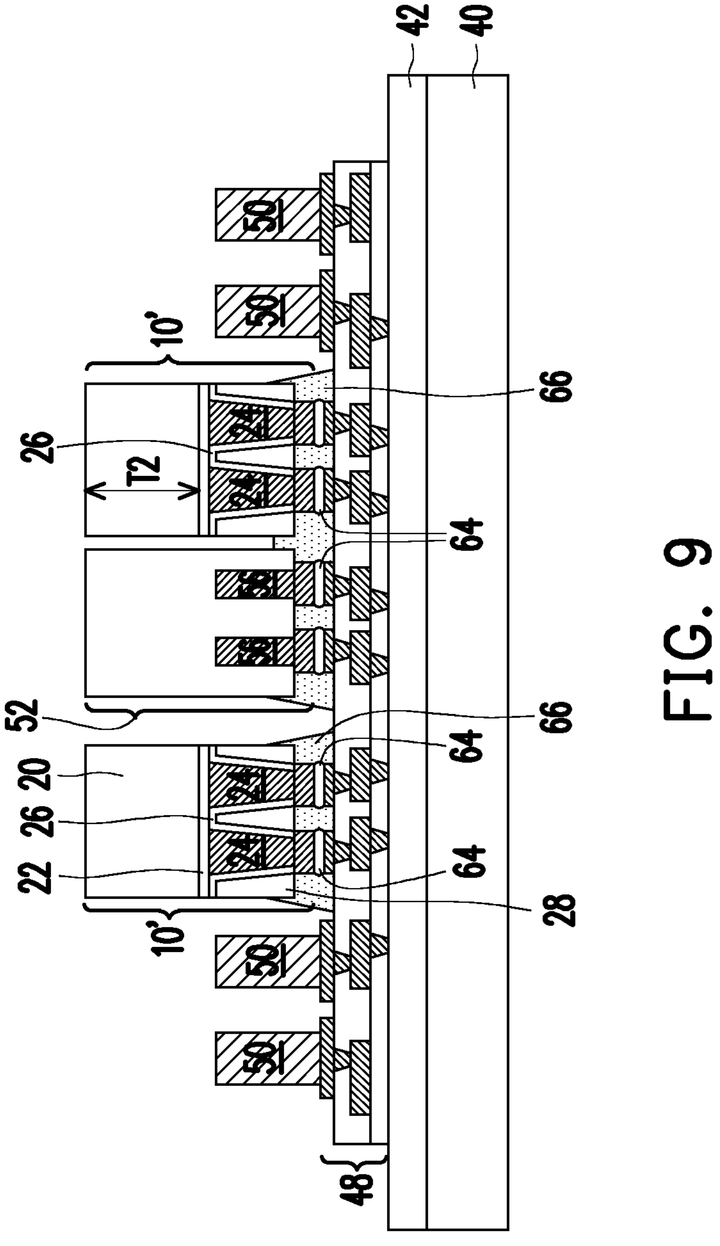

FIG. 9 illustrates the bonding of a plurality of dies to RDLs 46. The respective process is illustrated as process 218 in the process flow 200 as shown in FIG. 30. The bonded dies may include inductor die(s) 10 and discrete die 52. Discrete die 52 represents one or more of passive device dies, interconnect dies, and or the like that may be bonded in this process. For example, discrete die(s) 52 may include an Independent Passive Device (IPD) die including a capacitor therein, an IPD die including a resistor therein, an interconnect die for bridging two device dies, and/or the like.

Figure 28:
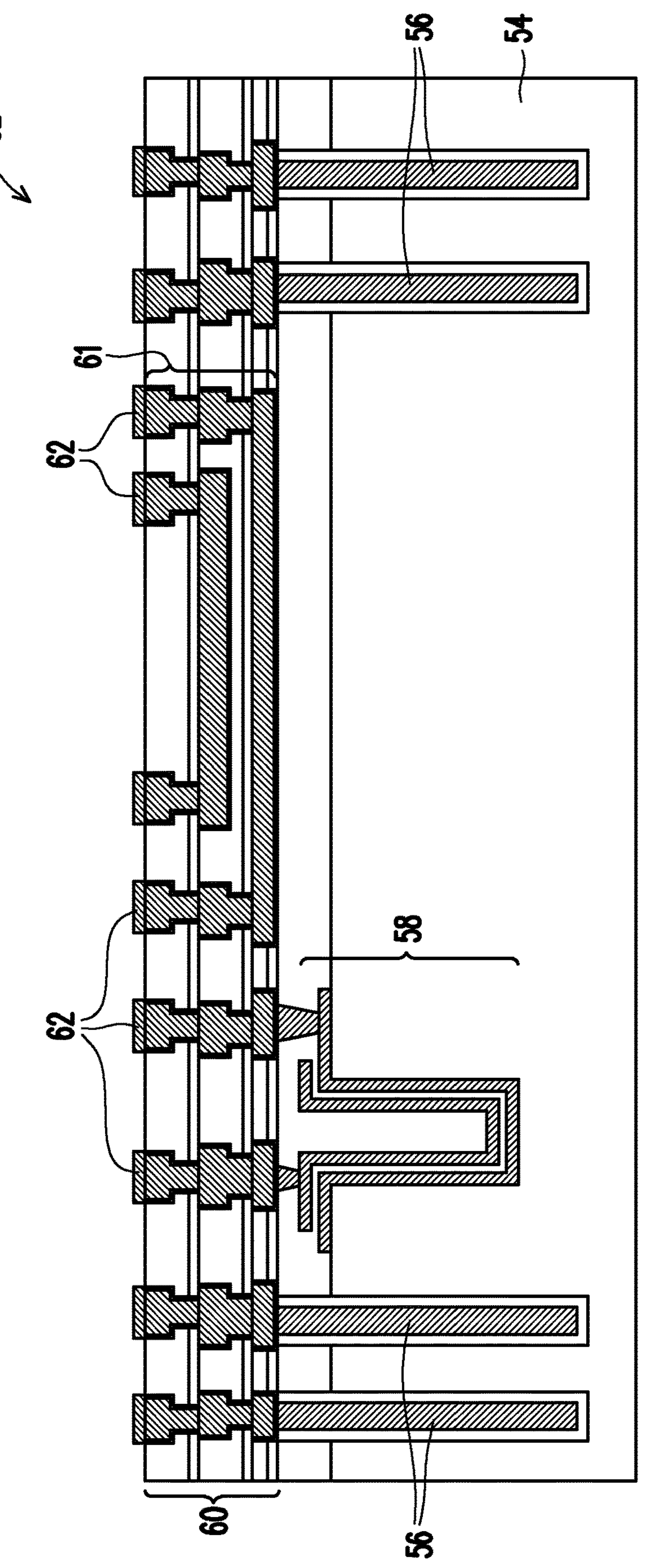
FIG. 28 illustrates a cross-sectional view of a discrete die comprising a deep-trench capacitor and through-vias in accordance with some embodiments.

FIG. 28 illustrates an example discrete die 52 in accordance with some embodiments. It is appreciated that discrete die 52 represents some of the possible structures of discrete dies, and may include one or more of features such as through-vias, interconnect paths, capacitors, and the like. Die 52 may include substrate 54, which may be a semiconductor substrate such as a silicon substrate. Substrate 54 may also be a dielectric substrate, which is formed of a dielectric material such as silicon oxide, silicon nitride, or the like. In accordance with some embodiments, there is no through-via formed to extend into, regardless of whether substrate 54 is formed of a semiconductor or a dielectric material. In accordance with alternative embodiments, through-vias 56 are formed to extend into substrate 54.

In accordance with some embodiments, discrete die 52 is free from active devices such as transistors and diodes therein. Discrete die 52 may or may not include passive devices such as capacitors, transformers, inductors, resistors, and the like. In accordance with alternative embodiments of the present disclosure, discrete die 52 include passive devices. For example, discrete die 52 may be an IPD die including capacitor 58 (which may be a deep-trench capacitor) formed in discrete die 52. Discrete die 52 may also be an IPD die including a resistor therein.

Discrete die 52 may act as a bridge die, and may include interconnect structure over substrate 54. Interconnect structure 60 further includes dielectric layers and metal lines and vias in the dielectric layers. The dielectric layers may include Inter-Metal Dielectric (IMD) layers. In accordance with some embodiments, some of the dielectric layers are formed of low-k dielectric materials having dielectric constant values (k-value) lower than 3.8, and the k-values may be lower than about 3.0 or about 2.5. The low-k dielectric layers may be formed of a carbon-containing low-k dielectric material, Hydrogen SilsesQuioxane (HSQ), MethylSilsesQuioxane (MSQ), or the like. The formation of the metal lines and vias may include single damascene and dual damascene processes. Bond structures 62 such as metal pillars or metal pads are formed at the surface of discrete die 52. Discrete die 52 may include bridges 61, which include metal lines and vias. Each of the bridges 61 is connected to two bond structures, so that the bridges 61 may be used to electrically interconnect two or more package components (such as device dies) in subsequent processes.

Referring back to FIG. 9, in accordance with some embodiments, the bonding of inductor die 10' and discrete die 52 to RDLs 46 may be performed through solder bonding or metal-to-metal direct bonding. For example, the bonding may be performed through solder regions 64. After the bonding, underfill 66 is dispensed into the gaps between discrete die 52, inductor die 10', and their corresponding underlying RDLs 46, and is then cured. In accordance with some embodiments, underfill 66 may include a base material, which may include a polymer, a resin, an epoxy, and/or the like, and filler particles in the base material. The filler particles may be dielectric particles of silica, alumina, boron nitride, or the like, and may have spherical shapes.

Figures 10, 11:
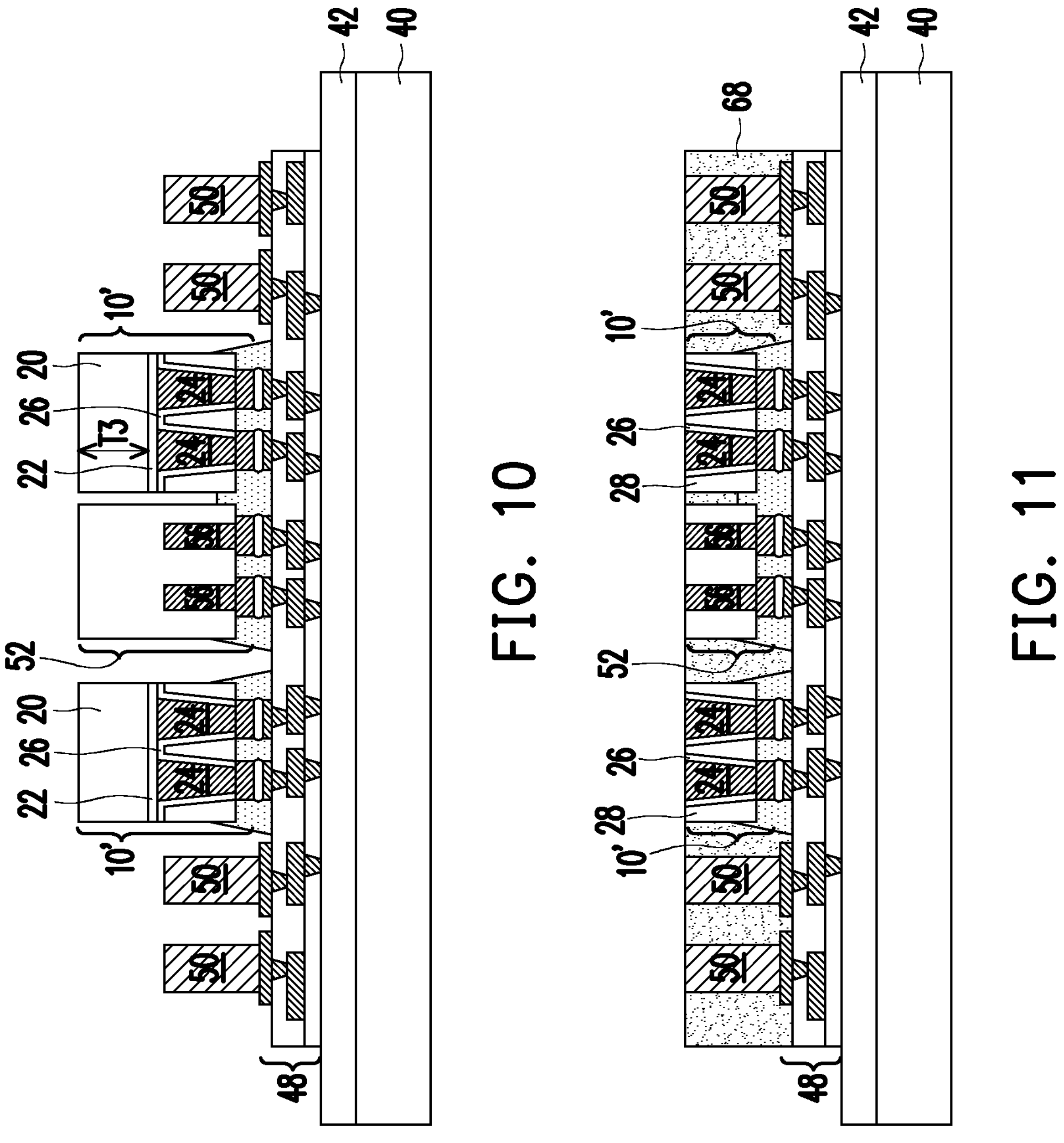

Referring to FIG. 10, a thinning process is performed to thin the substrates 20 and 54, of inductor die 10' and discrete die 52, respectively. For example, the thickness of substrate 20 may be reduced from thickness T2 in FIG. 9 to thickness T3 in FIG. 10. The respective process is illustrated as process 220 in the process flow 200 as shown in FIG. 30. The thinning process may reduce the aspect ratio of the gaps between neighboring inductor die 10', discrete die 52, and metal posts 50.

Next, encapsulant 68 is dispensed to encapsulate discrete die 52 and metal posts 50 therein, as shown in FIG. 11. The respective process is illustrated as process 222 in the process flow 200 as shown in FIG. 30. Encapsulant 68 fills the gaps between neighboring metal posts 50, inductor die 10', and discrete die 52. Encapsulant 68 may include a molding compound, a molding underfill, an epoxy, and/or a resin. When the encapsulation is finished, the top surface of encapsulant 68 is higher than the top ends of metal posts 50 and the top surfaces of discrete die 52. Encapsulant 68 may include a base material, which may be a polymer, a resin, an epoxy, or the like, and filler particles in the base material. The filler particles may be dielectric particles of silica, alumina, boron nitride, or the like, and may have spherical shapes.

A planarization process such as a Chemical Mechanical Polish (CMP) process or a mechanical grinding process is then performed to thin encapsulant 68, inductor die and discrete die 52, until metal posts 50 are revealed. The substrate 20 and dielectric layer 22 (FIG. 10) in inductor die 10' are removed, and metal vias 24 are exposed. Furthermore, the horizontal portions of magnetic layer 26 are also removed, leaving magnetic shells 26, which have cylindrical shapes. Metal posts 50 are alternatively referred to as through-vias 50 hereinafter since they penetrate through encapsulant 68. In accordance with some embodiments in which discrete die 52 includes through-vias 56, the substrate 54 (FIG. 28) is thinned from bottom, and through-vias 56 are also revealed by the planarization process. If capacitor 58 (FIG. 28) is formed, however, capacitor 58 is not thinned.

Due to the planarization process, the filler particles, which may be spherical particles, in encapsulant 68 are also polished. Accordingly, the polished spherical particles become partial spherical particles, which include planar top surfaces and rounded bottom surfaces. The planar top surfaces are coplanar with the top surface of the base material in encapsulant 68.

Figure 12:
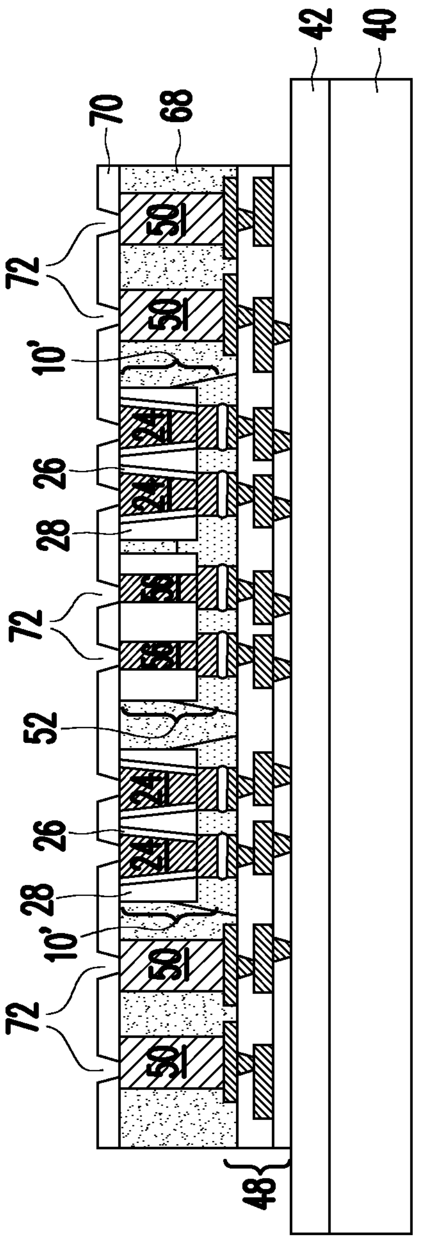

FIG. 12 illustrates the formation and the patterning of dielectric layer 70 in accordance with some embodiments. Dielectric layer 70 may be or may comprise an organic material such as a polymer, which may be a photo-sensitive polymer such as PBO, polyimide, or the like. Dielectric layer 70 may also be formed of or comprise an inorganic material such as silicon oxide, silicon nitride, or the like.

Dielectric layer 70 is patterned to form openings 72, with through-vias 50 and 56 and metal vias 24 being exposed through openings 72. In accordance with some embodiments, the openings 72 directly over metal vias 24 have lateral dimensions smaller than the lateral dimensions of metal vias 24, so that magnetic shells 26 are underlying and covered by the patterned dielectric layer 70. This may prevent magnetic shells 26 from being contaminated in subsequent processes. When through-vias 56 (FIG. 28) are formed in discrete die 52, an isolation dielectric layer (not shown) may be (or may not be) formed in discrete die 52, with the dielectric layer contacting the back surface of semiconductor substrate 54 (shown in FIG. 28). The isolation dielectric layer may be formed of or comprise silicon oxide, silicon nitride, or the like.

Figure 13:
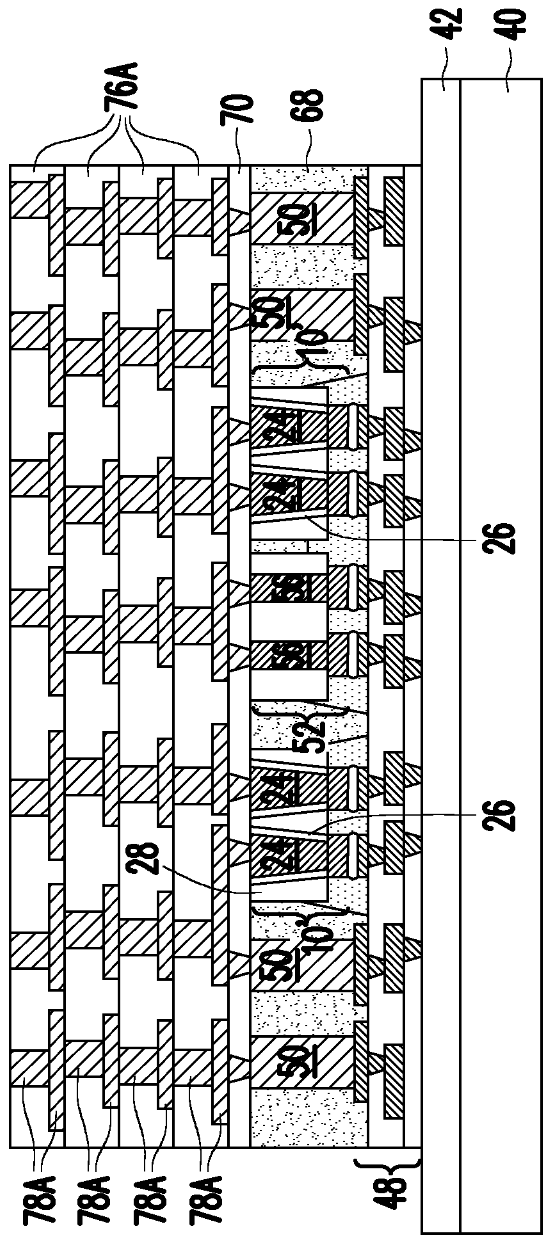
Figure 14:
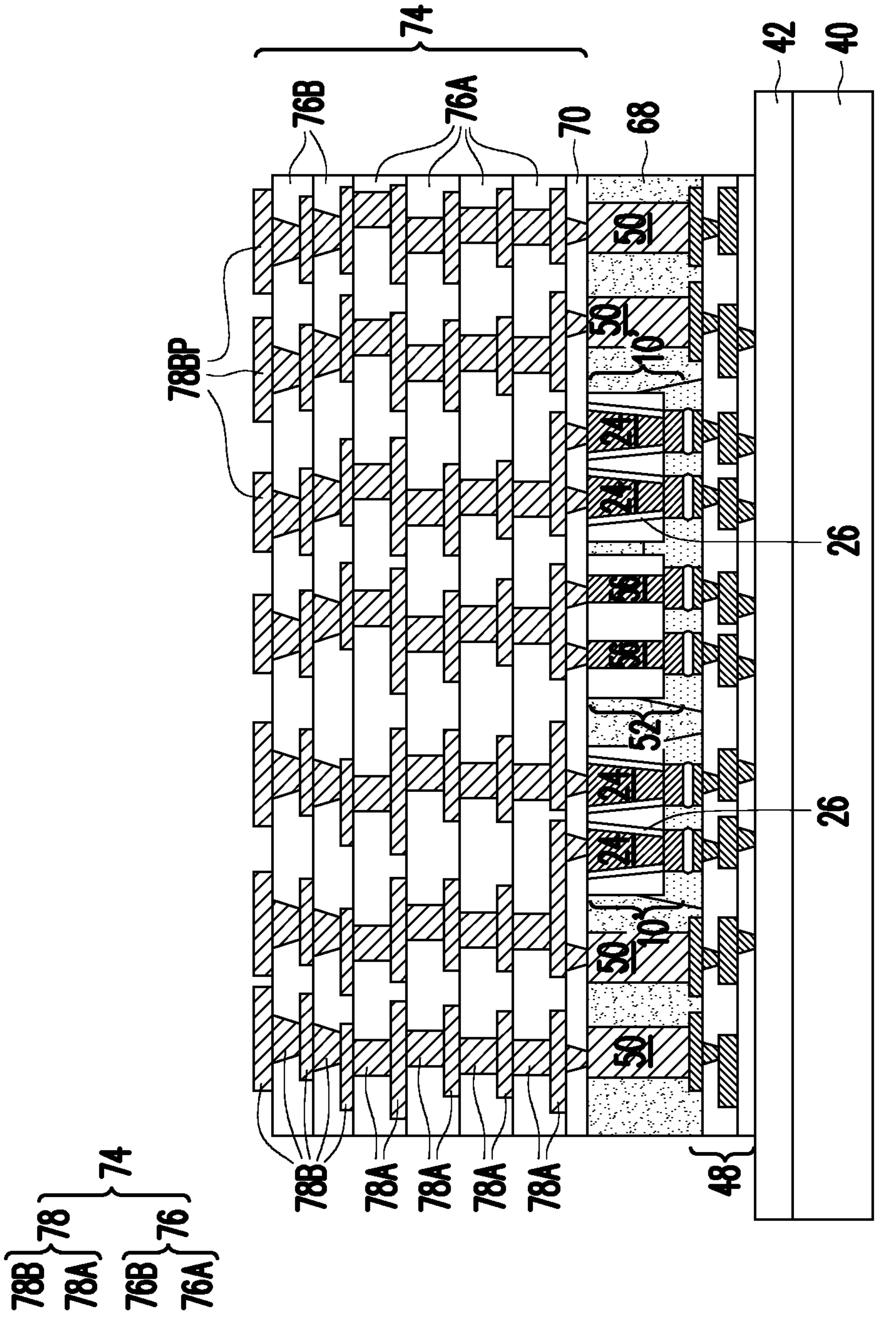

FIGS. 13 and 14 illustrate the formation of redistribution structure 74 over discrete die 52. The respective process is illustrated as process 224 in the process flow 200 as shown in FIG. 30. In accordance with some embodiments, redistribution structure 74 includes dielectric layers 76A and dielectric layers 76B over dielectric layers 76A. Dielectric layers 76A and dielectric layers 76B may be formed of different materials and have different thicknesses. For example, each or some of the dielectric layers 76A may be thicker than each or some of the dielectric layers 76B. In accordance with some embodiments, dielectric layers 76A are formed of a non-photo-sensitive material such as molding compound, molding underfill, silicon oxide, silicon nitride, or the like. Dielectric layers 76B, on the other hand, may be formed of a photo-sensitive material(s) such as PBO, polyimide, or the like. In accordance with alternative embodiments, both of dielectric layers 76A and 76B are formed of photo-sensitive material(s).

RDLs 78A are formed in dielectric layers 76A, and RDLs 78B are formed in dielectric layers 76B. In accordance with some embodiments, RDLs 78A are thicker and/or wider than RDLs 78B, and may be used for long-range electrical routing, while RDLs 78B may be used for short-range electrical routing. RDLs 78A and 78B are electrically connected to through-vias 50 and through-vias 56 (FIG. 29, when formed). Some surface conductive features 78BP are formed, which may be parts of RDLs 78B, or may be separately formed Under-Bump Metallurgies (UBMs).

In accordance with some embodiments, RDLs 78A and 78B are electrically connected to interconnect structure 48 through through-vias 50. In accordance with alternative embodiments, through-vias 50 are not formed. Accordingly, all of the connections of RDLs 78A and 78B to interconnect structure 48 are made through through-vias 56 in discrete die 52. Since through-vias 56 may be formed smaller than through-vias 50, more interconnection can be made. In accordance with yet alternative embodiments, the electrical connections of RDLs 78A and 78B to interconnect structure 48 are made through both of through-vias 56 in discrete die 52 and through-vias 50.

Figure 15:
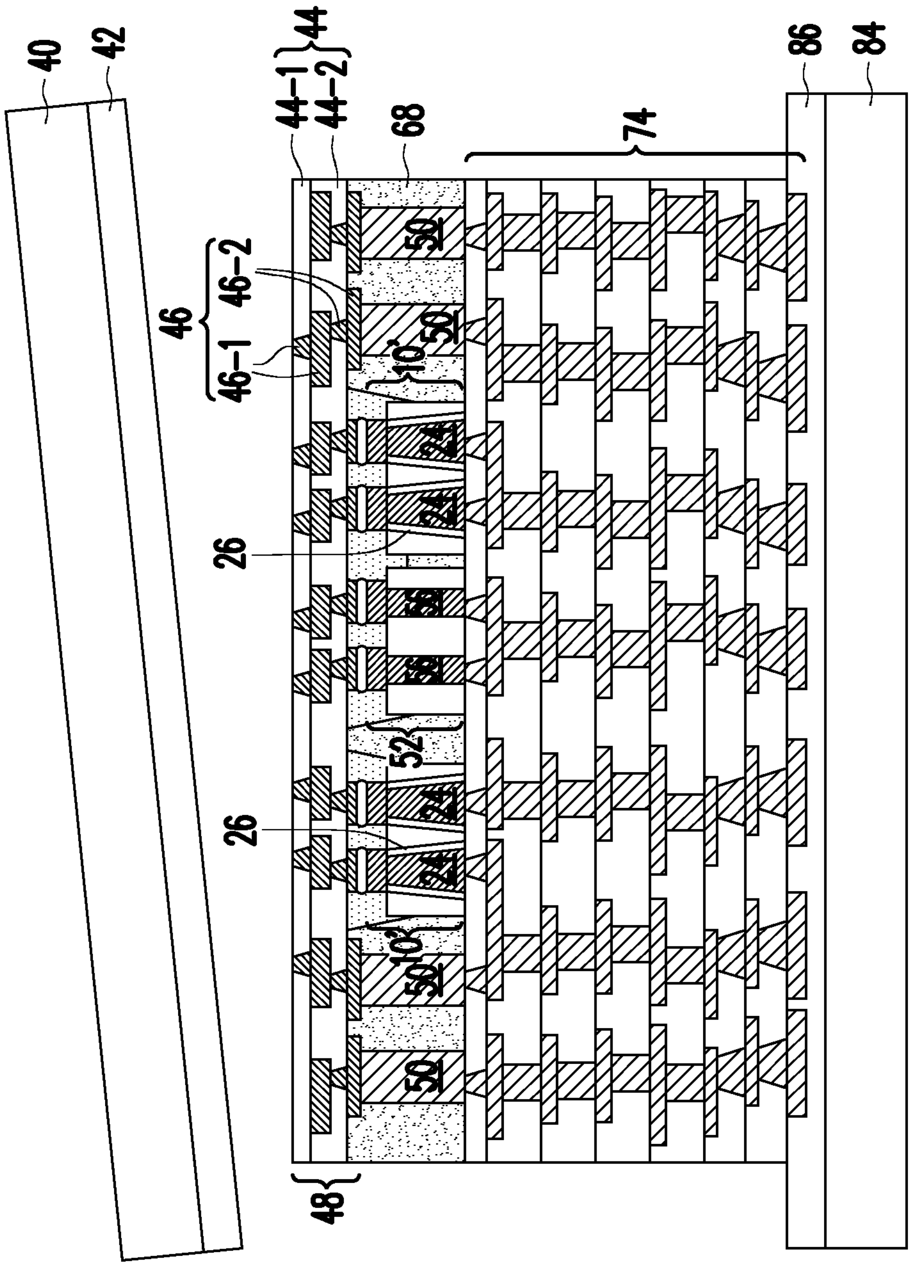

In a subsequent process, as show in FIG. 15, a carrier-switch process is performed. The respective process is illustrated as process 226 in the process flow 200 as shown in FIG. 30. In the carrier-switch process, redistribution structure 74 is first attached to carrier 84 through release film 86. Carrier 84 is formed of a transparent material, and may be a glass carrier, a ceramic carrier, or the like. Release film 86 may be formed of an LTHC coating material. Carrier 40 is then de-bonded from interconnect structure 48. In the de-bonding process, a light beam (which may be a laser beam) is projected on release film 42, and the light beam penetrates through the transparent carrier 40. Release film 42 is thus decomposed. Carrier 40 may be lifted off from release film 42, and hence redistribution structure 74 is de-bonded (demounted) from carrier 40.

Figure 16:
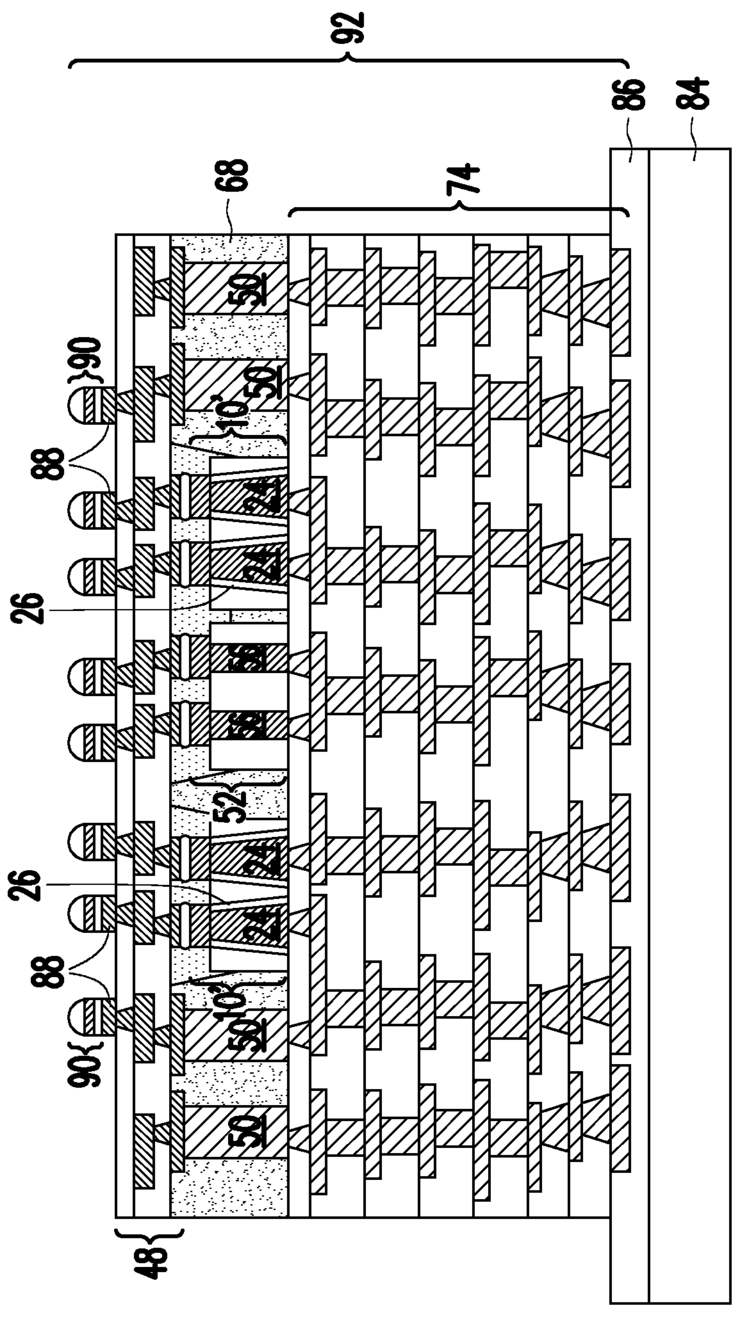

FIG. 16 illustrates the formation of UBMs 88 and electrical connectors 90 in accordance with some embodiments. The respective process is illustrated as process 228 in the process flow 200 as shown in FIG. 30. UBMs 88 may be formed of or comprise nickel, copper, titanium, or multi-layers thereof. Electrical connectors 90 are then formed on UBMs 88. The formation of electrical connectors 90 may include placing solder balls on the exposed portions of UBMs 88, and then reflowing the solder balls, and hence electrical connectors 90 are solder regions. In accordance with alternative embodiments of the present disclosure, the formation of electrical connectors 90 includes performing a plating process to form solder layers, and then reflowing the solder layers. Electrical connectors 90 may also include non-solder metal pillars, or may have composite structures including metal pillars and solder caps over the non-solder metal pillars, which may also be formed through plating. Throughout the description, the structure over release film 86 is referred to as composite interconnect structure 92.

Figure 17:
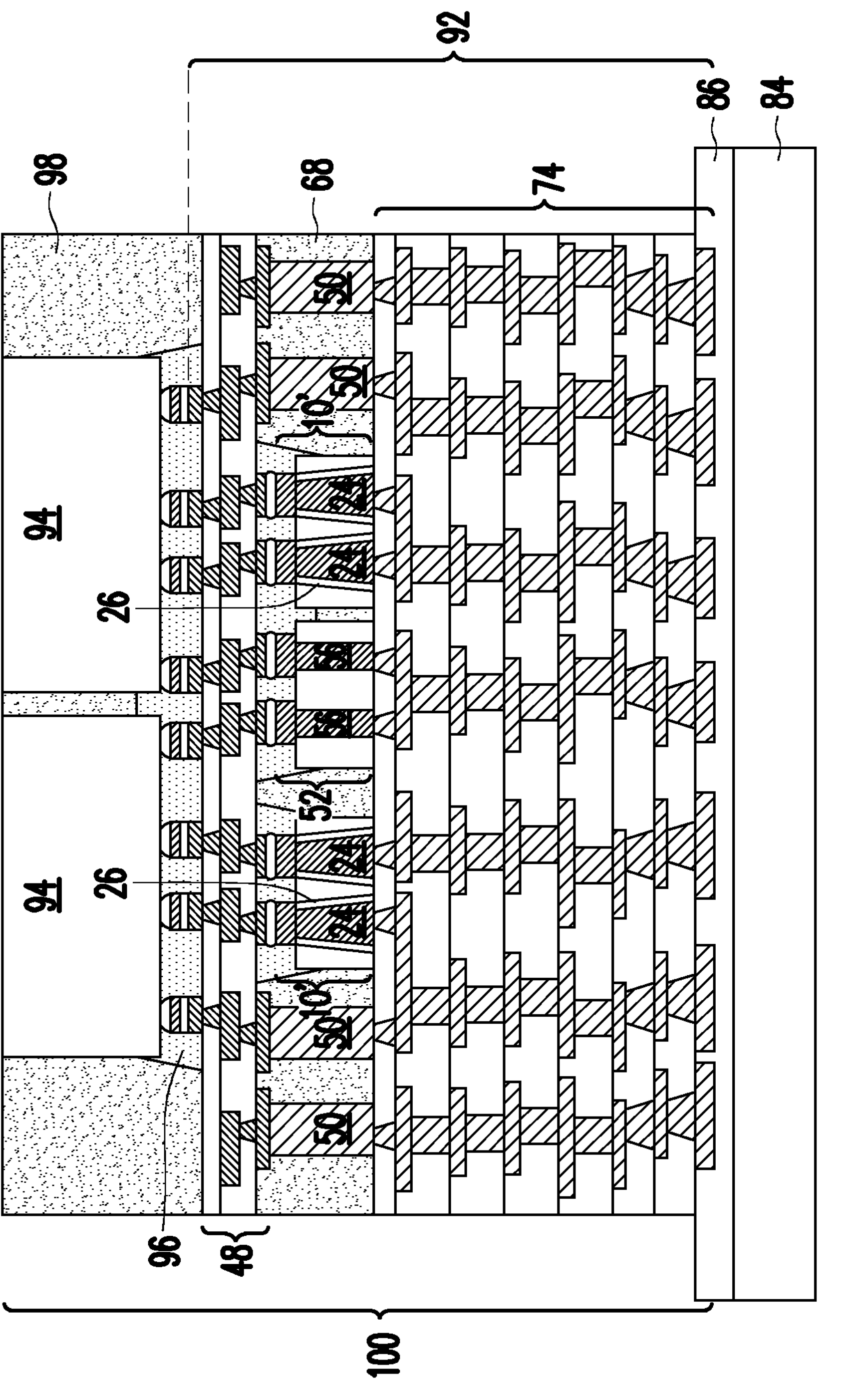

Referring to FIG. 17, a plurality of package components 94 are bonded to composite interconnect structure 92. The respective process is illustrated as process 230 in the process flow 200 as shown in FIG. 30. Package 100 is thus formed. In accordance with some embodiments, package components 94 include a logic die, which may be a Central Processing Unit (CPU) die, a Graphic Processing Unit (GPU) die, a mobile application die, a Micro Control Unit (MCU) die, an input-output (IO) die, a BaseBand (BB) die, an Application processor (AP) die, or the like. Package components 94 may also include a memory die(s) such as Dynamic Random-Access Memory (DRAM) dies, Static Random-Access Memory (SRAM) dies, or the like. The memory dies may be discrete memory dies, or may be in the form of a die stack that includes a plurality of stacked memory dies. Package components 94 may also include System-on-Chip (SOC) dies.

Next, underfill 96 is dispensed into the gap between package components 94 and the underlying composite interconnect structure 92. Package components 94 are then encapsulated in encapsulant 98, which may include a molding compound, a molding underfill, or the like.

Figure 18:
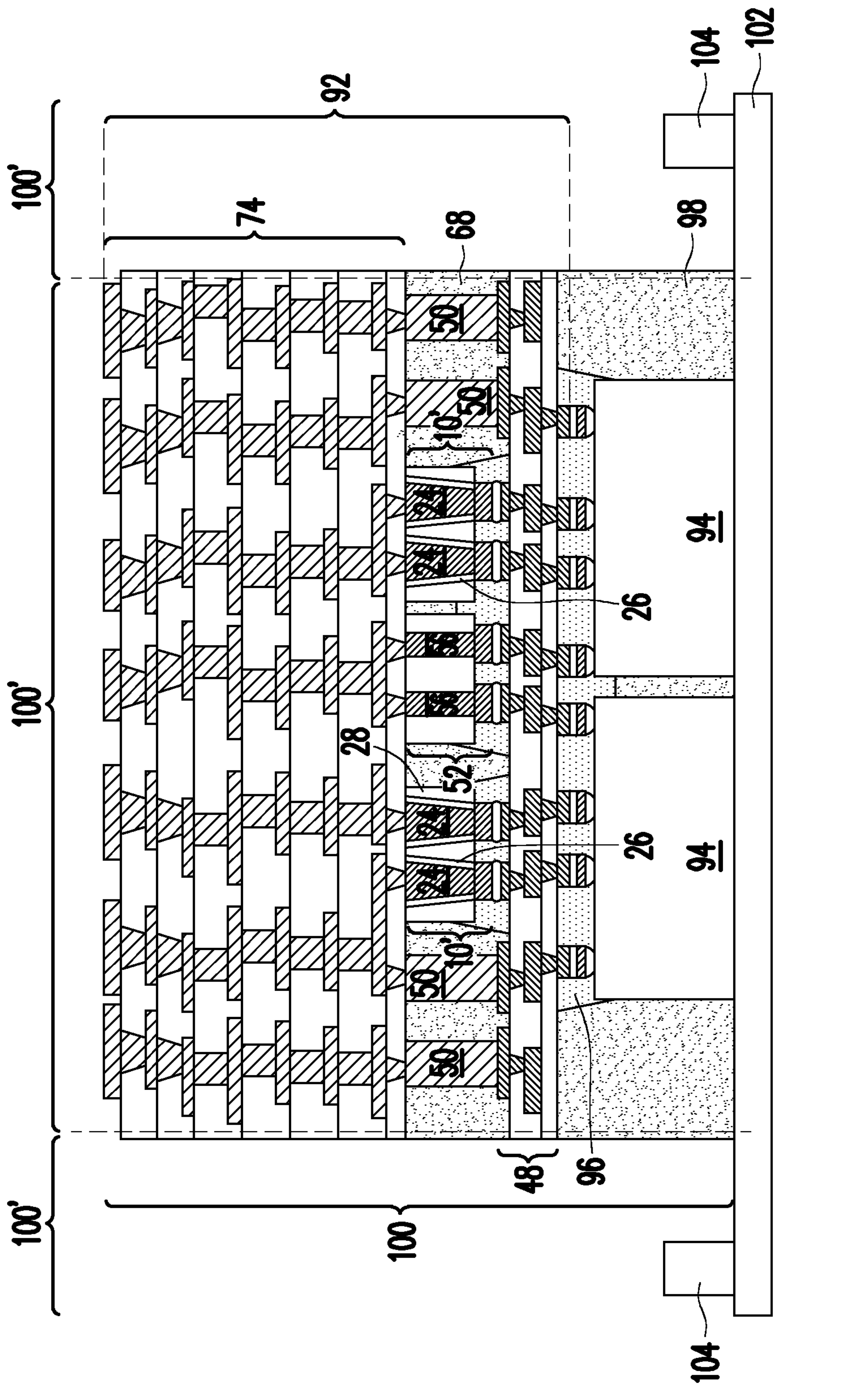

Next, package 100 is de-bonded (demounted) from carrier 84. The respective process is illustrated as process 232 in the process flow 200 as shown in FIG. 30. The de-bonding may be performed, for example, by projecting a light beam (which may be a laser beam) on release film 86, and the light beam penetrates through the transparent carrier 84. Release film 86 is thus decomposed. Carrier 84 is lifted off from release film 86, and hence package 100 is de-bonded (demounted) from carrier 84. The resulting package 100 is shown in FIG. 18. Package 100 is then placed on tape 102, which may be fixed on a frame 104. In accordance with some embodiments, package 100 is singulated in a sawing process, and is separated into a plurality of packages 100' that have structures identical to each other. In accordance with alternative embodiments, the sawing process is performed after the process shown in FIG. 19.

Figure 19:
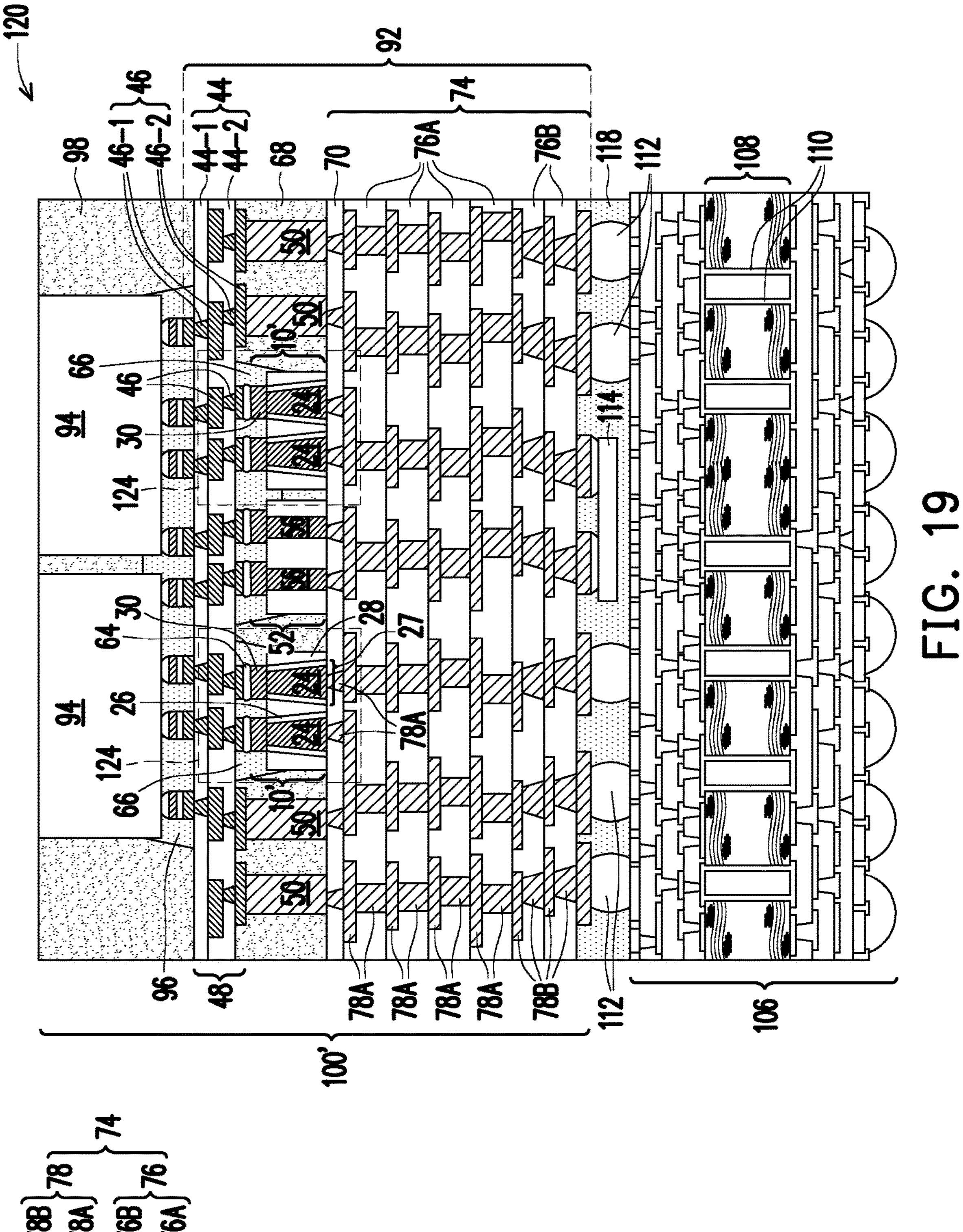

FIG. 19 illustrates the bonding of IPD 114 and package substrate 106 to package 100'. The respective process is illustrated as process 234 in the process flow 200 as shown in FIG. 30. IPD 114 may be a capacitor die, an inductor die, a resistor die, or the like. Package substrate 106 may include organic dielectric layers, and are sometimes referred to as organic package substrates. Package substrate 106 may also be cored package substrates including cores, or may be core-less package substrates that do not have cores therein. For example, package substrate 106 may include dielectric core 108, and Plating Through-Holes (PTHs, which are conductive pipes) 110 therein.

In accordance with alternative embodiments, package substrate 106 is in an un-sawed wafer, and is bonded to package 100' through wafer-to-wafer bonding or die-to-wafer bonding (with packages 100' being in the die form). In accordance with alternative embodiments, package substrate 106 is a discrete substrate, and is bonded to package 100' through die-to-die bonding. Package substrate 106 is free from active devices such as transistors and diodes therein. The bonding may be achieved through solder regions 112. Underfill 118 is dispensed between package 100' and package substrate 106. Package 120 is thus formed.

In accordance with some embodiments, inductor die 10' and discrete die 52 are embedded in the composite interconnect structure 92'. Inductor die 10' and discrete die 52 are electrically and signally connected to package components 94. Each metal via 24 and its corresponding encircling magnetic shell 26 collectively form an inductor 27. In accordance with some embodiments, the inductors 27 in an inductor die 10' are connected in series or in parallel to form a composite inductor 124. There may also be some of inductors 27 used individually without being interconnected with each other. For example, the RDLs 78A underlying lying metal vias 24 and the RDLs 46 overlying metal vias 24 may interconnect metal vias 24 and magnetic shells 26. The interconnection of individual inductors 27 into a composite inductor 124 may also include solder regions 64. FIG. 29 illustrates a perspective view of inductor 124, which includes a plurality of inductors 27 (each including a metal via 24 and a magnetic shell 26) and the corresponding RDLs 46 and 78A.

The composite inductor 124 formed in accordance with the embodiments of the present application has a unique structure. The magnetic shells 26 in composite inductor 124 does not surround all of the conductive wires (including metal vias 24, RDLs 46, and RDLs 78A). Rather, the magnetic shells 26 surround metal vias 24, while RDLs 46 and RDLs 78B has no magnetic shells formed thereon.

Inductor 27/124 and the capacitors (such as capacitor 58 in FIG. 28) and/or resistors may be interconnected to form an RLC circuit, an LC circuit, or an RL circuit, which may be used to regulate the power provided to package components 94. For example, when power is provided from the bottom side of package 120, the RLC circuit, the LC circuit, or the RL circuit may be connected between package substrate 106 and package components 94.

FIGS. 20 through 27 illustrate the cross-sectional views of intermediate stages in the formation of a package in accordance with alternative embodiments. These embodiments are similar to the embodiments as shown in FIGS. 7-19, except that no RDLs are formed before the placement of inductor chip 10 and discrete die 52. Rather, the RDLs are formed after the formation of interconnect structure 74 and the bonding of package components 94. Unless specified otherwise, the materials, the structures, and the formation processes of the components in these embodiments are essentially the same as the like components denoted by like reference numerals in the preceding embodiments. The details regarding the materials, the structures, and the formation processes of the components shown in FIGS. 20 through 27 may also be found in the discussion of the preceding embodiments.

Figure 25:
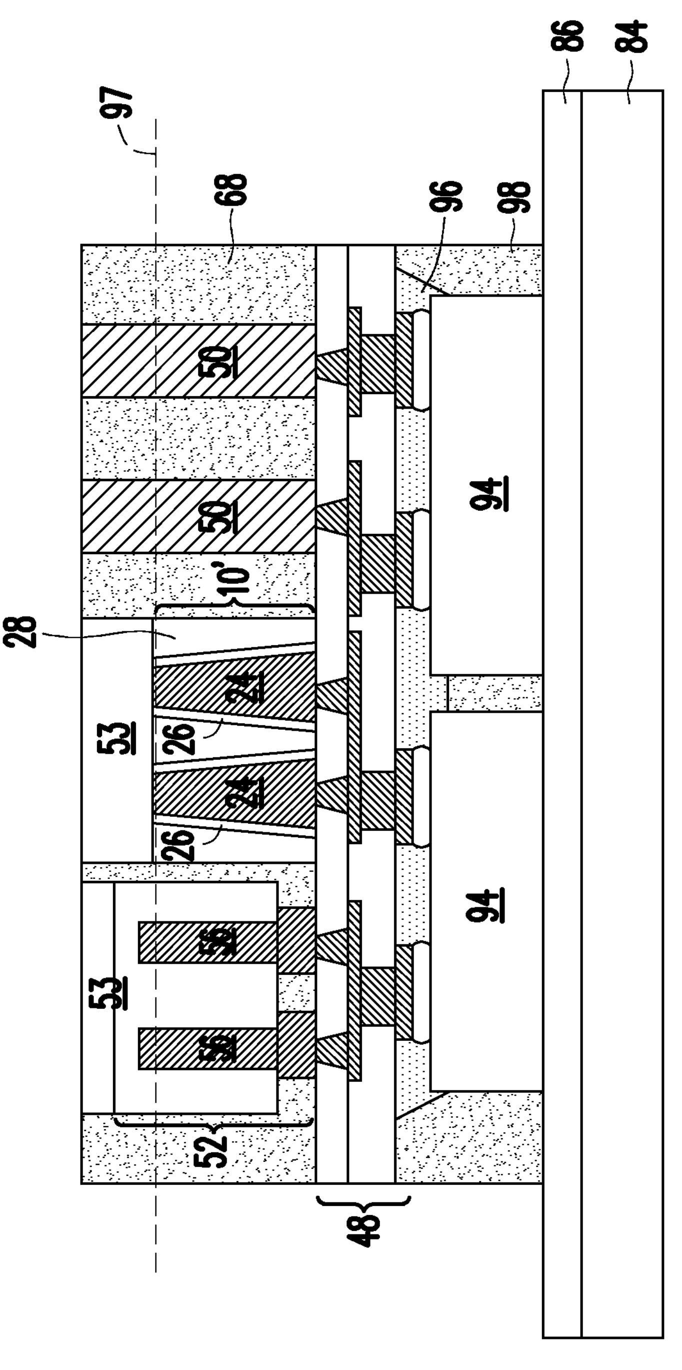
Figure 26:
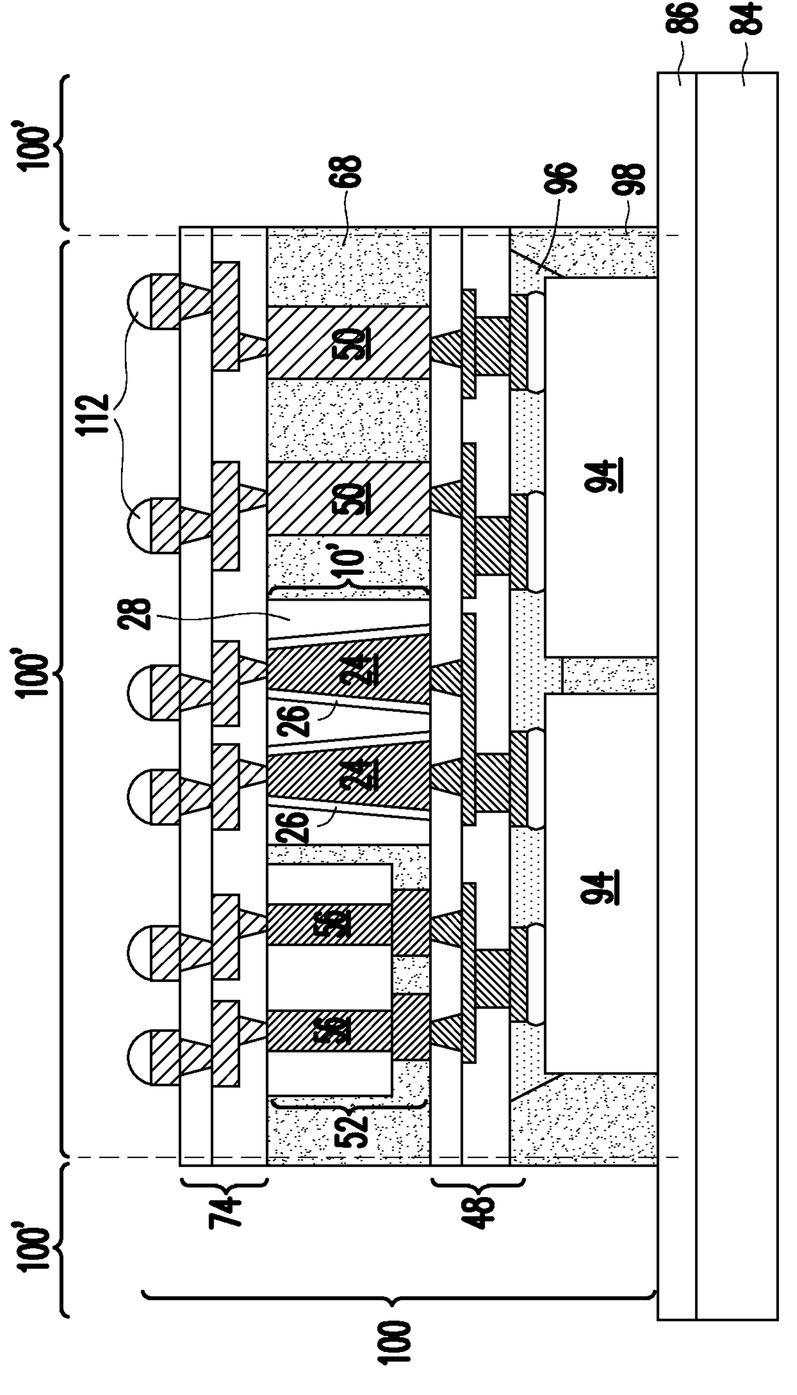
Figure 27:
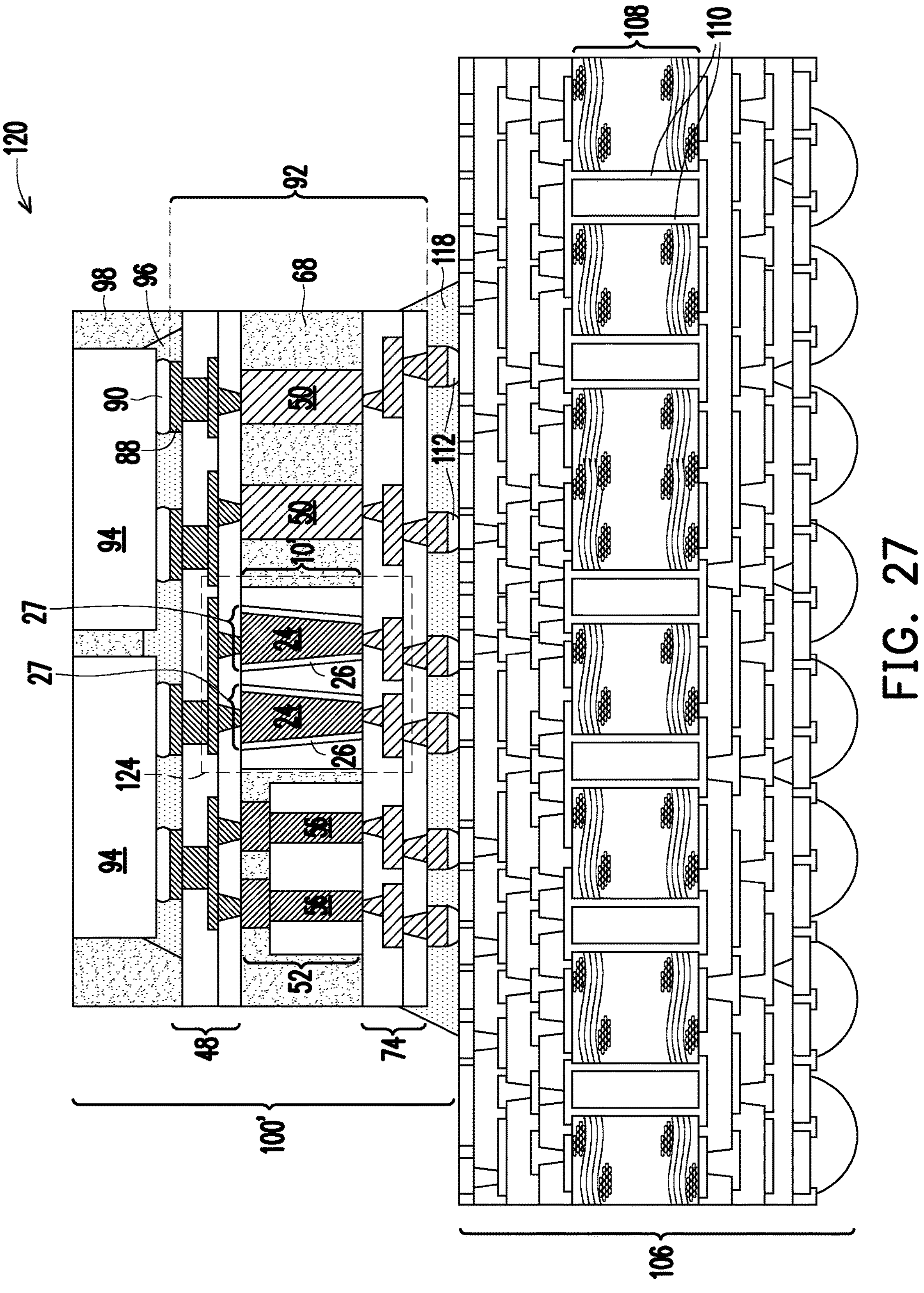

It is also appreciated that FIGS. 20 through 27 illustrate a simplified view of the formation of package 120. The detailed structure of the resulting package may be essentially the same as the package 120 in FIG. 19, except that in FIG. 19, the wider ends of metal vias 24 face package substrate 106, while in FIG. 27, the wider ends of metal vias 24 face package components 94. Also, the details of interconnect structure 74 in FIG. 27 is not shown, and may be found from FIG. 19. Similar to the structure shown in FIG. 19, although FIG. 27 illustrates one inductor die 10' as an example, there may also be more than one inductor die 10' in a resulting package 120.

Figure 20:
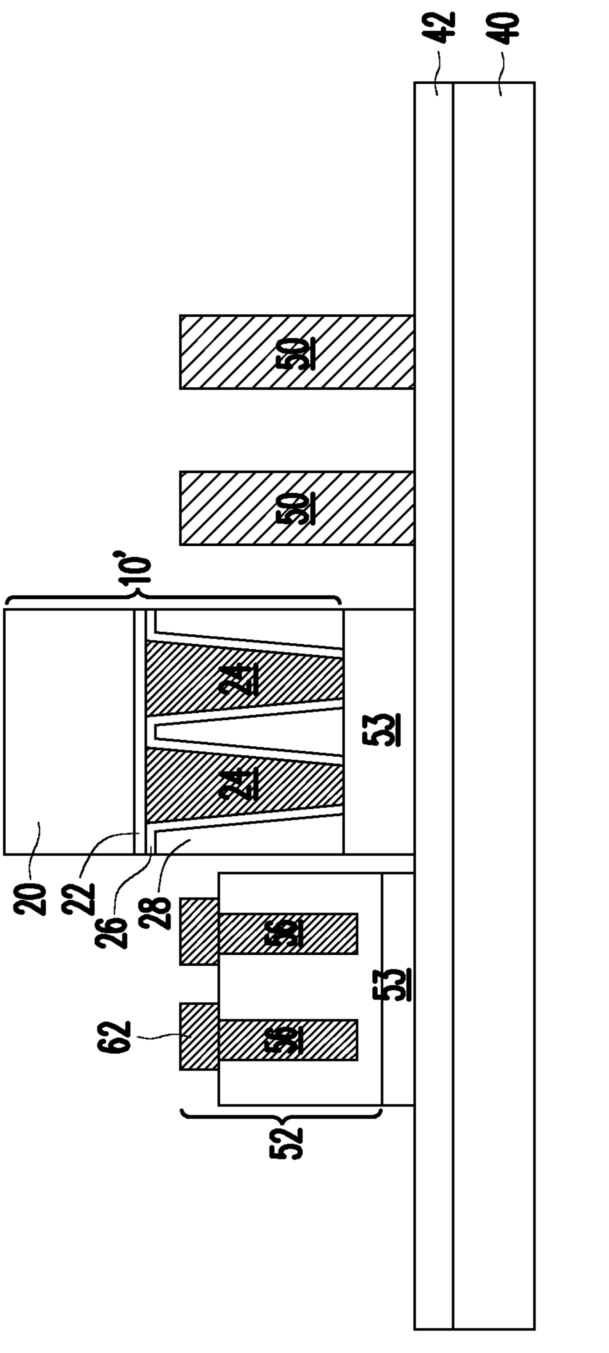
FIGS. 20-27 illustrate the cross-sectional views of intermediate stages in the formation of a package including an inductor die in accordance with some embodiments.

Referring to FIG. 20, inductor die 10' is formed, and is placed on release film 42, for example through Die-Attach Film (DAF) 53. Also, discrete die 52 may also be attached to release film 42 through another DAF 53. The electrical connectors 62 of discrete die 52 face up in accordance with these embodiments.

Figure 21:
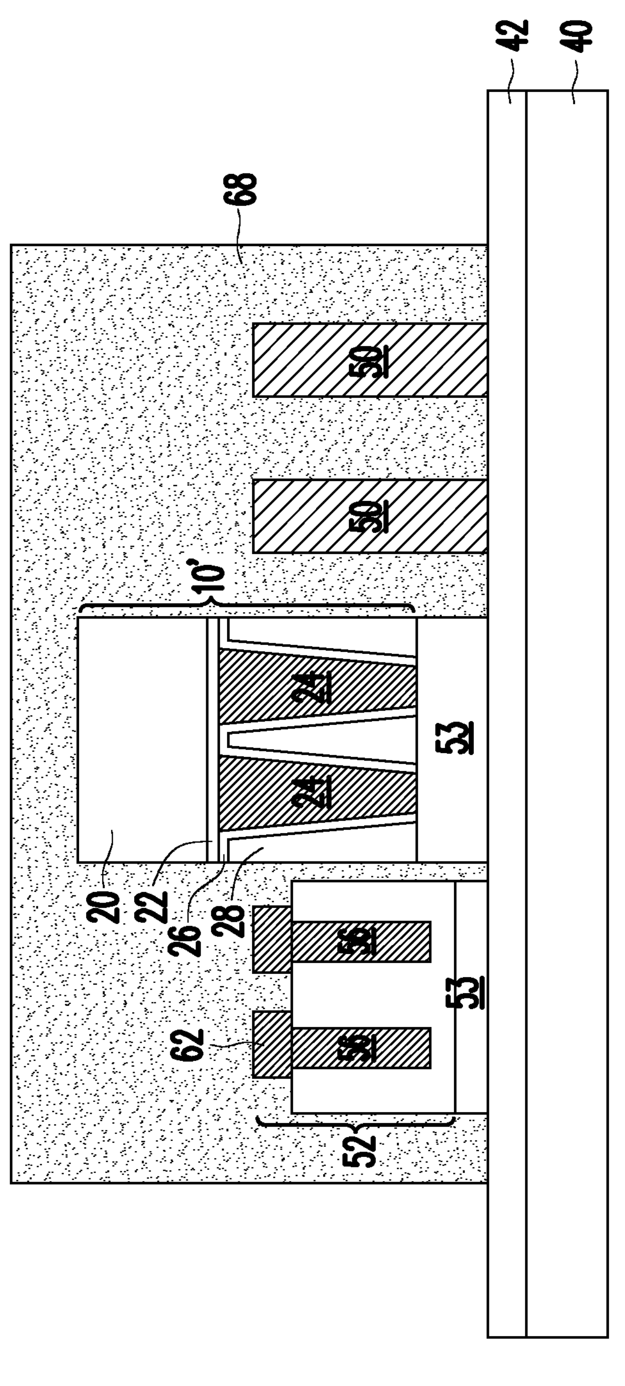
Figure 22:
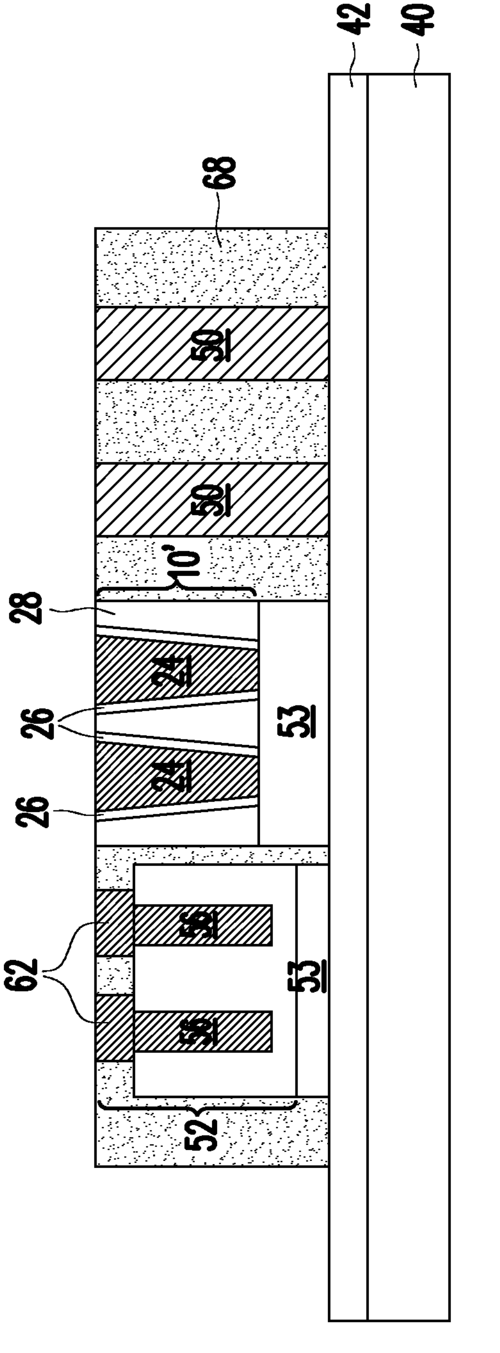

Next, the substrate 20 in inductor die 10' may be thinned, followed by the formation of encapsulant 68, as shown in FIG. 21. Referring to FIG. 22, a planarization process is then performed to remove substrate 20 and dielectric layer 22 from inductor die 10', and to reveal metal vias 24 and magnetic shells 26. The electrical connectors (bond structures) 62 in discrete die 52 are also revealed by the planarization process.

Figure 23:
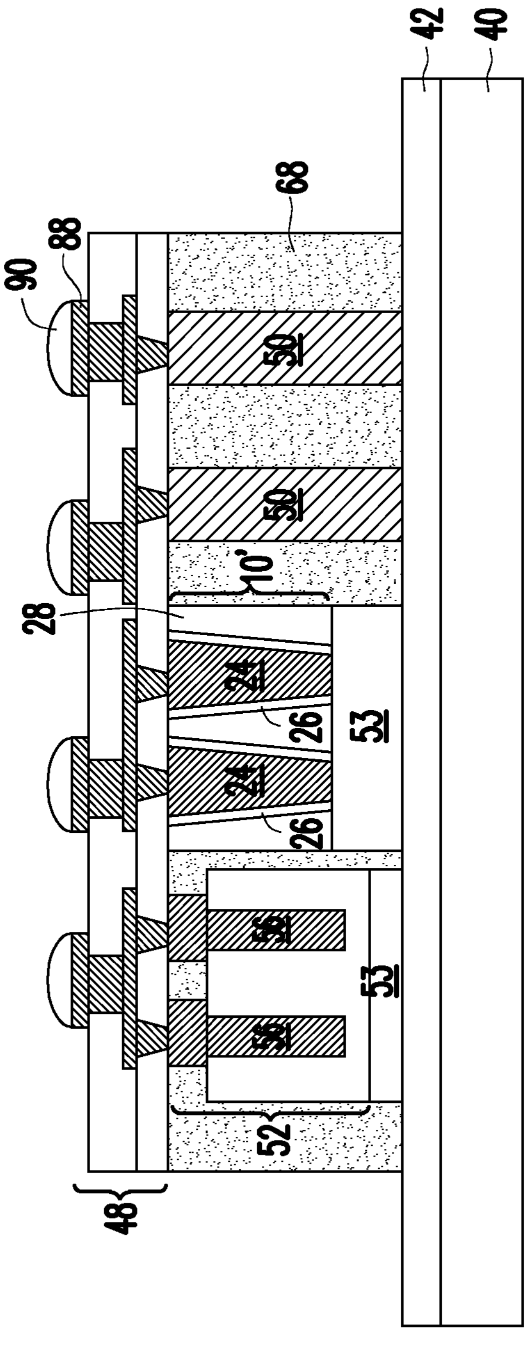

FIG. 23 illustrates the formation of interconnect structure 48, bond pads 88, and electrical connectors 90 in accordance with some embodiments. The details of interconnect structure 48 are not shown and discussed, and the details may be found referring to the discussion of FIGS. 12 through 14.

Figure 24:
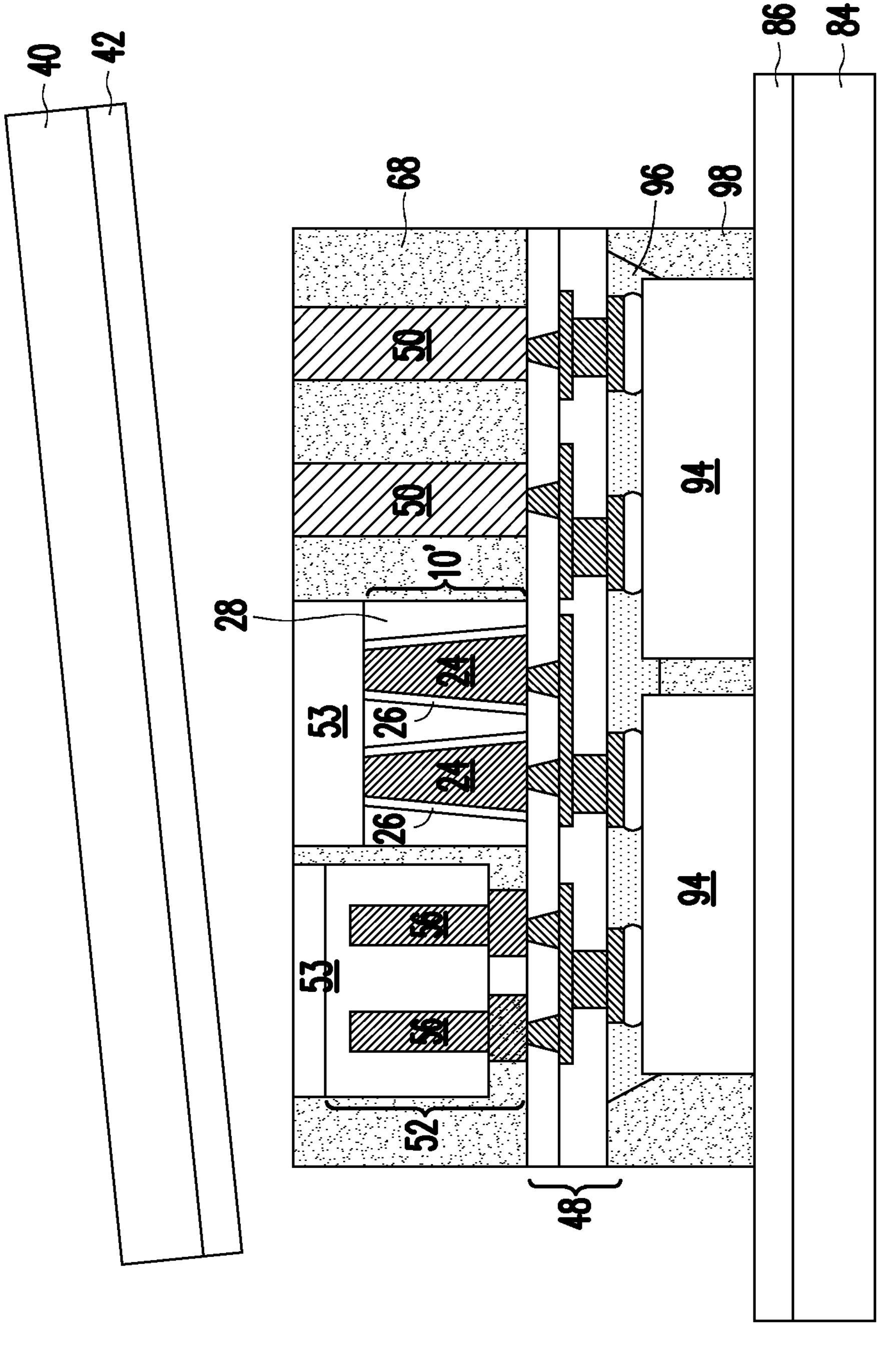

FIG. 24 illustrates the bonding of package components 94, the underfilling process using underfill 96, the encapsulation process using encapsulant 98, and the subsequent planarization process. A carrier-switch process is then performed, in which carrier 84 is attached to the formed structure through release film 86, and then carrier is debonded from the formed structure. The resulting structure is shown in FIG. 25.

Next, a planarization process is performed to remove DAFs 53. The planarization process may be performed until the portions of the features over level 97 are removed. Accordingly, when discrete die 52 includes through-vias 56 (also refer to FIG. 28), through-vias 56 are also revealed. When discrete die 52 includes capacitor 58 (FIG. 28), the planarization process is stopped before capacitor 58 is revealed, so that capacitor 58 is not damaged.

FIG. 26 illustrates the formation of interconnect structure 74 and electrical connectors 112 (such as solder regions) in accordance with some embodiments. Package 100 is thus formed. Next, package 100 may be de-bonded from carrier 84, and placed on a tape. Package 100 may then be sawed into a plurality of identical packages 100'.

Next, as shown in FIG. 27, package 100' is bonded to package substrate 106. Underfill 118 is dispensed between package 100' and package substrate 106. Package 120 is thus formed. Package 120 also includes inductors 27/124 (also refer to FIG. 29), which includes inductors 27 (each comprising one metal via 24 and one magnetic shell). Inductors 27 may be interconnected (refer to FIG. 29 also) to form composite inductor 124, which includes a plurality of inductors 27 and the connecting RDLs 46 and RDLs 78A, or may be used without being interconnected to form composite inductor 124.

In above-illustrated embodiments, some processes and features are discussed in accordance with some embodiments to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. Inductor dies are pre-formed, and are then packaged in packages to form inductors. The inductors may be used in power networks for power regulation. The inductor die may include composite inductors including vias and magnetic shells formed in the inductor dies, and may also include RDLs formed outside of the inductor die. Accordingly, the inductance of the respective inductors may be increased without making inductors too large/thick since the regions occupied by the RDLs are outside of the inductor dies.

In accordance with some embodiments, a method comprises forming an inductor die comprising forming a metal via over a substrate; forming a magnetic shell encircling the metal via, wherein the metal via and the magnetic shell collectively form an inductor; and depositing a dielectric layer around the magnetic shell; placing the inductor die over a carrier; encapsulating the inductor die in an encapsulant; forming redistribution lines electrically connecting to the inductor; and bonding a device die to the redistribution lines, wherein the device die is electrically coupled to the inductor through the redistribution lines. In an embodiment, the method further comprises placing a discrete die over the carrier, wherein the encapsulant further encapsulates the discrete die, wherein the discrete die comprises a device selected from the group consisting of a resistor, a capacitor, and combinations thereof, and wherein the discrete die is electrically coupled to the inductor.

In an embodiment, the method further comprises, when the metal via is formed, simultaneously forming a plurality of metal vias over the substrate; and when the magnetic shell is formed, simultaneously forming a plurality of magnetic shells, each encircling one of the plurality of metal vias. In an embodiment, the plurality of metal vias are interconnected through the redistribution lines to form a composite inductor. In an embodiment, the method further comprises performing a first planarization process to reveal a first end of the metal via; and forming a first conductive feature contacting the first end of the metal via. In an embodiment, the method further comprises performing a second planarization process to reveal a second end of the metal via; and forming a second conductive feature contacting the second end of the metal via. In an embodiment, the first conductive feature extends laterally beyond respective edges of the magnetic shell, and wherein the first conductive feature contacts top surfaces of the magnetic shell.

In an embodiment, the encapsulating the inductor die comprises applying the encapsulant; and planarizing the encapsulant, wherein an entirety of the substrate in the inductor die is removed when the encapsulant is planarized. In an embodiment, the magnetic shell is formed through a conformal deposition process, and wherein in the planarizing the encapsulant, horizontal portions of the magnetic shell are removed. In an embodiment, the method further comprises forming a metal post over the carrier, wherein the metal post is encapsulated in the encapsulant to form a through-via penetrating through the encapsulant.

In accordance with some embodiments, a structure comprises a first plurality of redistribution lines; an inductor die over and bonded to the first plurality of redistribution lines, wherein the inductor die comprises a first metal via; and a first magnetic shell encircling the first metal via; an encapsulant encapsulating the inductor die therein; a second plurality of redistribution lines over and electrically connected to the inductor die; and a package component over the second plurality of redistribution lines, wherein the package component is electrically connected to the inductor die through the second plurality of redistribution lines. In an embodiment, the inductor die further comprises a dielectric layer encircling the first magnetic shell, wherein the dielectric layer extends to edges of the inductor die, and wherein the encapsulant contacts the edges of the dielectric layer. In an embodiment, a first top surface of the first metal via is coplanar with a second top surface of the first magnetic shell.

In an embodiment, a first bottom surface of the first metal via is coplanar with a second top bottom surface of the first magnetic shell. In an embodiment, the inductor die further comprises a second metal via; and a second magnetic shell encircling the second metal via, wherein the first metal via and the second metal via are electrically connected through some of the first plurality of redistribution lines and the second plurality of redistribution lines to form an inductor. In an embodiment, the inductor die further comprises a second metal via; and a second magnetic shell encircling the second metal via, wherein the first metal via and the second metal via are neither interconnected in series nor connected in parallel. In an embodiment, the structure further comprises a discrete die in the encapsulant, wherein the discrete die comprises a capacitor, and wherein the inductor die and the discrete die are electrically connected with each other.

In accordance with some embodiments, a structure comprises an inductor die comprising an inductor therein, the inductor comprising a metal via; and a magnetic shell encircling the metal via; a metal pad over and contacting both of a first top surface of the metal via and a second top surface of the magnetic shell; a dielectric layer underlying and contacting both of a first bottom surface of the metal via and a second bottom surface of the magnetic shell; a redistribution line underlying and contacting the first bottom surface of the metal via; a molding compound, with the inductor die being in the molding compound; and a device die electrically connected to the inductor. In an embodiment, the structure further comprises an underfill, wherein the metal pad physically contacts the underfill. In an embodiment, the inductor die is free from active devices therein.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming an inductor die comprising:

forming a metal via over a substrate;

forming a magnetic shell encircling the metal via, wherein the metal via and the magnetic shell collectively form an inductor; and depositing a dielectric layer around the magnetic shell;

placing the inductor die over a carrier;

encapsulating the inductor die in an encapsulant;

forming redistribution lines electrically connecting to the inductor; and bonding a device die to the redistribution lines, wherein the device die is electrically coupled to the inductor through the redistribution lines.

2. The method of claim 1 further comprising:

placing a discrete die over the carrier, wherein the encapsulant further encapsulates the discrete die, wherein the discrete die comprises a device selected from the group consisting of a resistor, a capacitor, and combinations thereof, and wherein the discrete die is electrically coupled to the inductor.

3. The method of claim 1 further comprising:

when the metal via is formed, simultaneously forming a plurality of metal vias over the substrate; and when the magnetic shell is formed, simultaneously forming a plurality of magnetic shells, each encircling one of the plurality of metal vias.

4. The method of claim 3, wherein the plurality of metal vias are interconnected through the redistribution lines to form a composite inductor.

5. The method of claim 1 further comprising:

performing a first planarization process to reveal a first end of the metal via; and forming a first conductive feature contacting the first end of the metal via.

6. The method of claim 5 further comprising:

performing a second planarization process to reveal a second end of the metal via; and forming a second conductive feature contacting the second end of the metal via.

7. The method of claim 5, wherein the first conductive feature extends laterally beyond respective edges of the magnetic shell, and wherein the first conductive feature contacts top surfaces of the magnetic shell.

8. The method of claim 1, wherein the encapsulating the inductor die comprises:

applying the encapsulant; and planarizing the encapsulant, wherein an entirety of the substrate in the inductor die is removed when the encapsulant is planarized.

9. The method of claim 8, wherein the magnetic shell is formed through a conformal deposition process, and wherein in the planarizing the encapsulant, horizontal portions of the magnetic shell are removed.

10. The method of claim 1 further comprising:

forming a metal post over the carrier, wherein the metal post is encapsulated in the encapsulant to form a through-via penetrating through the encapsulant.

11. A method comprising:

forming a first plurality of redistribution lines;

bonding an inductor die over the first plurality of redistribution lines, wherein the inductor die comprises:

a first metal via; and a first magnetic shell encircling the first metal via;

encapsulating the inductor die in an encapsulant;

forming a second plurality of redistribution lines over and electrically connected to the inductor die; and bonding a package component over the second plurality of redistribution lines, wherein the package component is electrically connected to the inductor die through the second plurality of redistribution lines.

12. The method of claim 11 further comprising forming the inductor die comprising:

forming a dielectric layer encircling the first magnetic shell; and sawing through the dielectric layer.

13. The method of claim 11, wherein a first top surface of the first metal via is coplanar with a second top surface of the first magnetic shell.

14. The method of claim 13, wherein a first bottom surface of the first metal via is coplanar with a second bottom surface of the first magnetic shell.

15. The method of claim 11 further comprising forming the inductor die comprising:

forming a second metal via; and forming a second magnetic shell encircling the second metal via, wherein the first metal via and the second metal via are electrically connected through some of the first plurality of redistribution lines and the second plurality of redistribution lines to form an inductor.

16. The method of claim 11 further comprising forming the inductor die comprising:

forming a second metal via; and forming a second magnetic shell encircling the second metal via, wherein at a time before the second plurality of redistribution lines are formed, the first metal via and the second metal via are neither interconnected in series nor connected in parallel.

17. The method of claim 11 further comprising encapsulating a discrete die in the encapsulant, wherein the discrete die comprises a capacitor, and wherein the inductor die and the discrete die are electrically connected with each other.

18. A method comprising:

forming a dielectric layer;

forming a redistribution line in the dielectric layer;

bonding an inductor die over the redistribution line, the inductor die comprising an inductor therein, wherein the inductor die comprises:

a metal via electrically connected to the redistribution line; and a magnetic shell encircling the metal via;

molding the inductor die in a molding compound; and electrically connecting a device die to the inductor.

19. The method of claim 18 further comprising dispensing an underfill, wherein the inductor die physically contacts the underfill.

20. The method of claim 18, wherein the inductor die is free from active devices therein.

* * * * *